United States Patent [19]

Chang

[11] Patent Number: 5,112,699
[45] Date of Patent: May 12, 1992

[54] METAL-METAL EPITAXY ON SUBSTRATES AND METHOD OF MAKING

[75] Inventor: Chin-An Chang, Peekskill, N.Y.

[73] Assignee: International Business Machines Corporation, Armonk, N.Y.

[21] Appl. No.: 529,033

[22] Filed: May 25, 1990

Related U.S. Application Data

[63] Continuation-in-part of Ser. No. 492,050, Mar. 12, 1990, abandoned.

[51] Int. Cl.⁵ .................. B32B 15/20; C30B 25/18
[52] U.S. Cl. ............................ 428/641; 428/674; 428/938; 428/686; 156/610; 156/612
[58] Field of Search .......... 428/615, 641, 674, 675, 428/676, 677, 671, 669, 938, 686; 156/610, 612

[56] References Cited

U.S. PATENT DOCUMENTS

| | | | |
|---|---|---|---|
| 3,375,418 | 3/1968 | Garnache et al. | 156/612 |
| 3,382,099 | 5/1968 | Montmory | 117/215 |
| 3,904,782 | 9/1975 | Pomerantz | 156/610 |
| 3,929,527 | 12/1975 | Chang et al. | 148/175 |
| 3,936,529 | 2/1976 | Roth | 156/610 |
| 3,996,095 | 12/1976 | Ahn et al. | 152/612 |
| 4,174,422 | 11/1979 | Matthews et al. | 428/673 |
| 4,235,662 | 11/1980 | Reitz | 156/612 |
| 4,325,776 | 4/1982 | Menzel | 156/610 |
| 4,430,183 | 2/1984 | Schuller et al. | 156/610 |
| 4,652,499 | 3/1987 | Howard | 428/641 |
| 4,654,276 | 3/1987 | Ahlert et al. | 428/641 |
| 4,707,197 | 11/1987 | Hensel et al. | 437/189 |
| 4,707,756 | 11/1987 | Futamoto et al. | 428/641 |
| 4,745,005 | 5/1988 | Sugita et al. | 427/128 |
| 4,842,917 | 6/1989 | Ohno et al. | 428/141 |

OTHER PUBLICATIONS

Chang, Interface epitaxy and self-epitaxy of metals near room temperature, Phys Rev. B, 42 (18), Dec. 15, 1990, 11946-9.
Chang, (100) and (111) Ni films epitaxially grown on Cu by the metal-metal-epitaxy on silicon technique near room temperature, J. Vac. Sci. Technol A, 8(5), Sep.-/Oct. 1990, 3779-84.
Sekiguchi, Epitaxial Growth of Al (100) on Si (100) by Gas-Temperature Controlled Chemical Vapor Deposition, Japanese Journal of Appl. Phys., Extended Abstracts 21st. Conf. Solid State Devices and Materials (1989), pp. 29-32.
P. Etienne et al. "Critical Steps in the Molecular Beam Epitaxy of High Quality Ag/Fe Superlattices on (001) GaAs", Appl. Phys. Lett. 55(21), Nov. 20, 1989, pp. 2239-2241.
Y. Darici et al. "Leed Study of Fe Epitaxially Grown at 190° C. on Cu(100)", Surface Science 217 (1989) pp. 521-528.
Y. Chen et al. "Vibrational properties of epitaxial films on metal, II. fcc Ni on the Cu(001) surface", Phys. Rev. B, vol. 39, No. 9, Mar. 15, 1989, pp. 5617-5622.
D. Pescia, et al, "Ferromagnetism of Thin Epitaxial fcc Cobalt Films on Cu(001) Observed by Spin-Polarized Photoemission", Phys. Rev. Lett., vol. 55, No. 9, Mar. 2, 1987, pp. 933-936.
J.A.C. Bland, et al, "Ferromagnetic Moments in Metastable Magnetic Films by Spin-Polarized-Neutron Reflection", Phys. Rev. Lett., vol. 58, No. 12, Mar. 23, 1987, pp. 1244-1247.
S. Y. Tong, et al, "Vibrational properties of epitaxial films on metals. I. fcc Cu on the Ni(001) surface", Phys. Rev. B, vol. 39, No. 9, Mar. 15, 1989, pp. 5611-5616.
R. Miranda, et al, "Electronic Structure of a Cobalt Monolayer On Cu(100)" Surface Science 130 (1983) pp. 269-281.

(List continued on next page.)

*Primary Examiner*—John Zimmerman
*Attorney, Agent, or Firm*—Philip J. Feig

[57] ABSTRACT

Metal film and metal superlattice structures with controlled orientations are grown at room temperature using a silicon or germanium substrate coated with an epitaxially grown copper layer. The metal films are preferably deposited by electron beam evaporation without external heating of the copper coated substrate.

59 Claims, 29 Drawing Sheets

OTHER PUBLICATIONS

A. Amiri Hezaveh, et al, "Quenching of Exchange Splitting in Face Centred Cubic Fe Observed by Angle Resolved Photoemission", Solid State Communications, vol. 57, No. 5, pp. 329-334, 1986.

Ts. S. Marinova, et al, "Coadsorption of Carbon Monoxide and Hydrogen on Iridium Single Crystals", Surface Science 217 (1989) pp. 65-77.

C. Chang, "Interface morphology studies of (110) and (111) Ge-GaAs grown by molecular beam epitaxy" Appl. Phys. Lett. 40(12) Jun. 15, 1982, pp. 1037-1039.

C. Chang, "Interface morphology of epitaxial growth of Ge on GaAs and GaAs on Ge by molecular beam epitaxy", J. Appl. Phys. 53(2) Feb. 1982, pp. 1253-1255.

A. J. Slavin, "Thermal Fragmentation of Ethylene on the Rh(100) Single Crystal Surface in the Temperature Range of 200-800 K", Surface Science 206 (1988) pp. 124-144.

Mohamed H. Mohamed, "Surface-phonon dispersion in ultrathin epitaxial films of Ni on Cu(001), Phys. Rev. B", vol. 40, No. 2, Jul. 15, 1989, pp. 1305-1307.

ial metal films on GaAs substrates by means of molecular beam epitaxy (MBE) technique. The latter process is more complicated and costly than the MMES method. The cost involved of the MBE system and GaAs substrates as well as the growth process involved make the MMES method more attractive and practical for large scale applications. The principles of the MMES method is extendible to other growth techniques, including sputtering and other thin film deposition techniques.

METAL-METAL EPITAXY ON SUBSTRATES AND METHOD OF MAKING

CROSS-REFERENCE TO RELATED APPLICATIONS

This application is a continuation-in-part of application Ser. No. 07/492,050 filed Mar. 12, 1990, now abandoned.

BACKGROUND OF THE INVENTION

The present invention relates to growing metal-metal epitaxy on substrates at room temperature. Specifically, the invention relates to metal film and metal superlattice structures with controlled orientations grown at room temperature using a silicon or germanium substrate coated with an epitaxially grown copper layer.

Recent developments of epitaxial growth of metal layers at room temperatures provides a way of obtaining various metal structures for both scientific study and technological applications. The lack of suitable metallic substrates in thin film form has limited progress in the area.

The present invention describes a method which allows growth of metal films and metal-metal alternate structures, or superlattices, with controlled orientations. The method commences with a silicon or germanium substrate coated with an epitaxially grown copper film as the seed layer. The deposition is performed by conventional electron beam evaporation in a vacuum of low $10^{-7}$ torr, without intentional or externally applied heating of the substrate during the deposition process. When a silicon substrate is used, the technique just described is referred to as metal-metal epitaxy on silicon (MMES).

The MMES technique described uses silicon as the substrate with epitaxial grown copper film as the seeding layer for the epitaxial growth of other metals. This method differs from the technique of depositing epitaxial metal films on GaAs substrates by means of molecular beam epitaxy (MBE) technique. The latter process is more complicated and costly than the MMES method. The cost involved of the MBE system and GaAs substrates as well as the growth process involved make the MMES method more attractive and practical for large scale applications. The principles of the MMES method is extendible to other growth techniques, including sputtering and other thin film deposition techniques.

It is known in the art that metal films of controlled orientation are difficult to grow on each other due to the difficulty of obtaining seed metal layers with the desired orientation. According to the present invention, a novel method is disclosed in which a seed metal layer of controlled orientation, for example Cu, is first deposited on single crystal silicon. The subsequent deposition of other metals on a (100) copper film allows the growth of (100) oriented metal films. Metals such as nickel, cobalt, titanium, palladium, rhodium, iridium, zirconium and hafnium have been so deposited. Certain metals do not exhibit a lattice match with the copper seed layer. Such metals require one or more additional metal seed layers before epitaxial growth is achieved. For example, gold, silver, platinum, iron, vanadium and chromium which do not grow epitaxially on copper will grow epitaxially when palladium is first deposited on the copper film. Tungsten and molybdenum, for instance, do not grow epitaxially on palladium but will grow epitaxially when gold is first deposited on the palladium film. The result is a five layer metal-metal epitaxy on silicon structure. Niobium, which shows no epitaxial growth on palladium or gold, shows a partial epitaxy of (100) growth on (100) Mo. This is an example of six layer epitaxy on silicon. The method is performed using conventional electron beam evaporation in a vacuum of $10^{-7}$ torr, without intentional heating of the substrate during deposition. As a result, the method is readily applicable to a manufacturing line.

Following the described method, copper epitaxially deposits on silicon with (100) and (111) Cu films grown using (100) and (111) Si substrates, respectively. Using the deposited copper layer as a seeding layer, further epitaxial growth of other metals is accomplished. Metals which exhibit such an epitaxial relation on the copper layer include Ni, Co, Rh, Ir, Ti, Pd, Zr and Hf. Other metals such as Au, Ag, Pt, Fe, V and Cr, which do not grow epitaxially on copper, grow epitaxially on Pd using Pd/Cu/Si structures. Still other metals such as Mo and W, which do not grow epitaxially on Pd, grow epitaxially on Au using Au/Pd/Cu/Si structures. Still further metals such as Nb, which do not grow epitaxially on palladium or gold, grow epitaxially on Mo using Mo/Au/Pd/Cu/Si structures.

The present invention results in a single deposition of metal films with controlled orientation using conventional thin film evaporation techniques in a vacuum chamber without external heat applied to the substrate during deposition thereby minimizing reaction among components. The metal films thus deposited have many applications.

The magnetic metals such as Ni, Co and Fe, all as thin individual layers and as superlattices, are of interest to the magnetic community. Studies involving Cu-Ni, Cu-Co and Ni-Co superlattices exhibit magnetic properties which are clearly dependent upon orientation. Rh and Ir layers and superlattices have application in catalytic activity of the metal using single crystals of different orientations. Metals such as Ni, Pd and Fe are also of interest as catalysts. The MMES method provides a simple method for making metal films with controlled orientation at much lower cost and with less complication in sample surface preparation than heretofore known methods.

According to the present invention, a seed metal layer of controlled orientation, for example Cu, is first deposited on single crystal germanium. The subsequent deposition of other metals, such as Ni, on a (100) oriented copper film allows the growth of (100) oriented metal film. The results with germanium substrate have been similar to those described above in conjunction with silicon substrates.

The use of germanium as the substrate offers the advantage that it is possible to grow metal-metal structure with controlled orientations on GaAs substrate. In an article entitled "Interface morphology of epitaxial growth of Ge on GaAs and GaAs on Ge by molecular beam epitaxy" by Chin-An Chang in the Journal of Applied Physics, volume 53, page 1253 dated February 1982 and in an article entitled "Interface morphology studies of (110) and (111e Ge-GaAs grown by molecular beam epitaxy" by Chin-An Chang in Applied Physics Letters, volume 40, page 1037, dated June 1982 epitaxially grown germanium on GaAs using molecular beam epitaxy techniques is described. Such a germanium layer can be used as the substrate for the epitaxial growth of Cu, followed by other metals. After the Ge layer has been deposited on GaAs, the metallic layers or superlattices can be grown on the Ge/GaAs substrate either in the same molecular beam epitaxy system or in a separate chamber. The result is the simultaneous presence of both the magnetic metal structures and GaAs device structures on the same substrate for a variety of applications. Alternatively, it is possible to deposit Si on the GaAs substrate, followed by the deposition of the metal structures. In this regard, Ge is preferable due to the excellent lattice metal with GaAs; the mismatch is less than 0.1% for Ge-GaAs but more than 4% for Si-GaAs.

SUMMARY OF THE INVENTION

A principal object of the present invention is therefore, the provision of a method for growing metal films and metal-metal alternate structures or superlattices with controlled orientations.

Another object of the invention is the provision of a method for growing metal films and metal-metal alternate structures or superlattices with controlled orientation including the step of depositing an epitaxially grown copper film as a seed layer on a silicon or germanium substrate.

Further and still other objects of the present invention will become more clearly apparent when the following description is read in conjunction with the accompanying drawings.

DETAILED DESCRIPTION

Figure 1A:
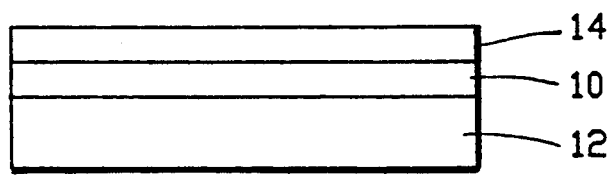
FIG. 1A is a side elevation view of a preferred embodiment of a three layer metal-metal epitaxy structure on a substrate.

Referring now to the figures and to FIG. 1 in particular, there is shown a thin film layer of copper 10 expitaxially deposited on a silicon substrate 12 by means of electron beam evaporation without any intentional or external heating of the substrate. Both (100) and (111) oriented copper films can be epitaxially deposited on (100) and (111) silicon, respectively. The (100) orientation of Cu persists up to a thickness of 2 $\mu$m.

The resultant copper film deposited on the silicon substrate is used as a substrate for further expitaxial growth of a third material 14. For instance, epitaxial growth of Ni and Co on the epitaxial Cu/Si layers result in metal-metal epitaxy on silicon. Further growth of Cu layers on the Ni and Co films retains the epitaxial relation making possible the growth of periodic epitaxial metal structures using the MMES method.

The method used to achieve epitaxial deposition is as follows. The (100) and (111) silicon wafers are degreased, etched in buffered hydrofluoric acid and dried before being placed into the evaporator. The base pressure of the evaporator is low $10^{-7}$ torr and a deposition rate of 10 Å/sec is used for the metals. The layer thickness of the Cu, Ni and Co films are 1000 Å.

Figure 2:
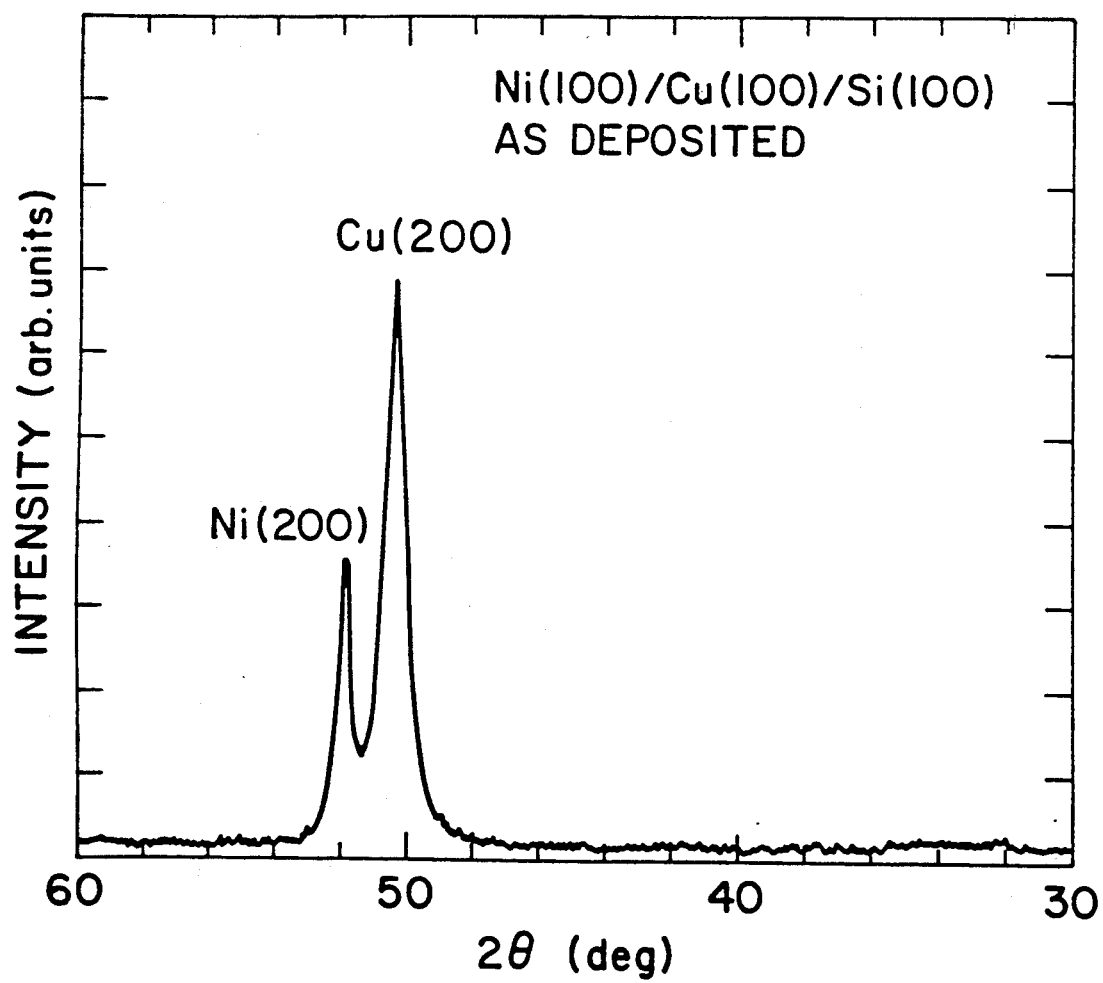
FIG. 2 is a graphical representation of an X-ray diffraction pattern of (100)Ni/(100)Cu/(100)Si structure manufactured in accordance with the present invention.
Figure 3:
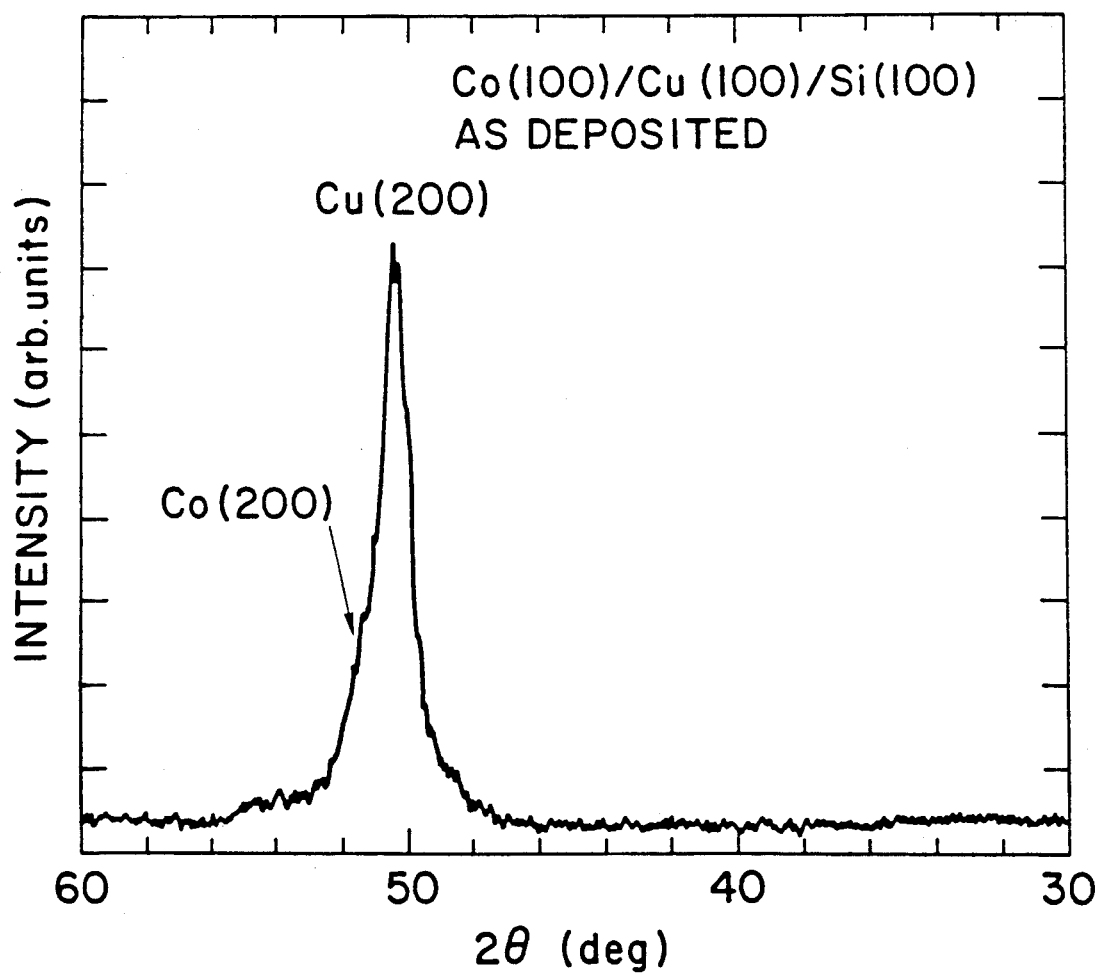
FIG. 3 is a graphical representation of an X-ray diffraction pattern of (100)Co/(100)Cu/(100)Si structure manufactured in accordance with the present invention.
Figure 4:
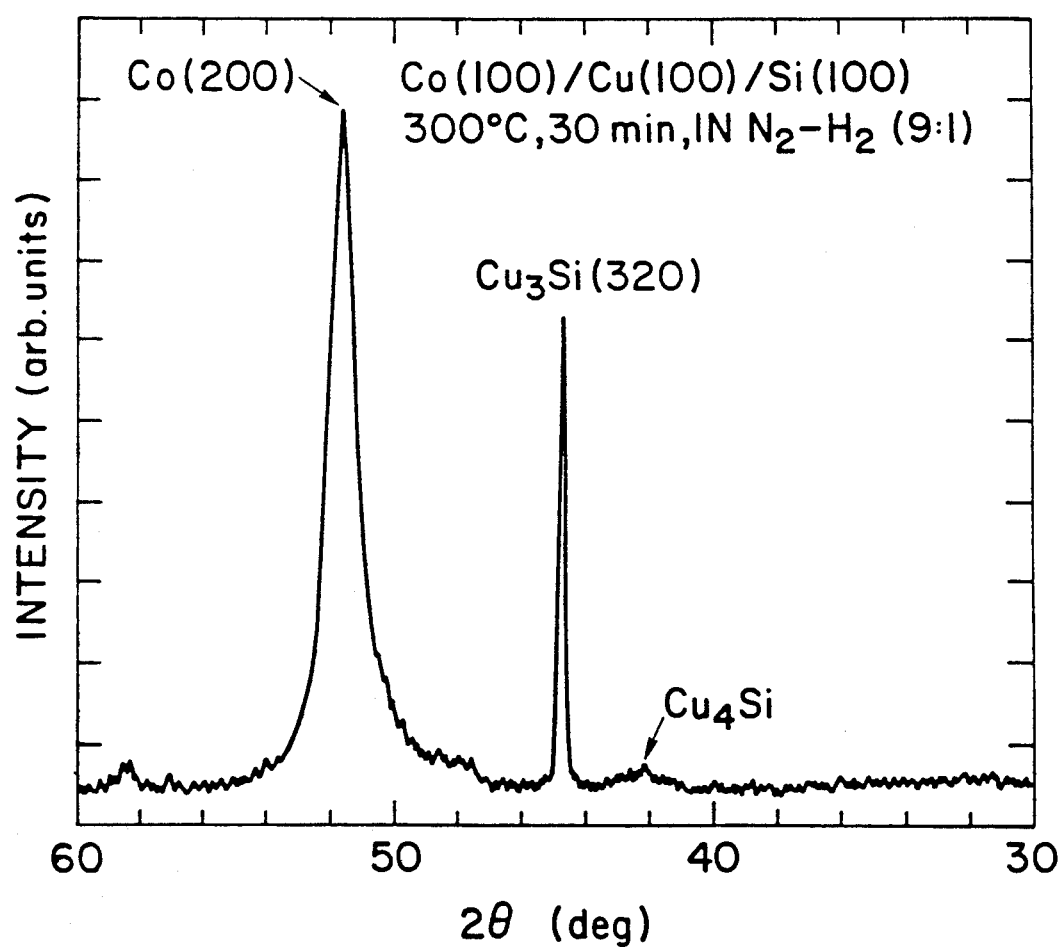
FIG. 4 is a graphical representation of an X-ray diffraction pattern of (100)Co/(100)Cu/(100)Si structure manufactured in accordance with the present invention. The structure is heated to 300° C. to consume the Cu present, allowing the Co(200) peak to be seen.

A single layer of Ni or Co is deposited on the (100)Cu/(100)Si structure, with the same orientation obtained. Films of (100)Ni and (100)Co are generally difficult to grow with conventional thin film deposition processes. Ni tends to grow in the (111) orientation, which is the preferred orientation for the face-centered cubic metals such as Ni and Cu. Co, on the other hand, grows in either the hexagonal form or the face-centered cubic form. The preferred orientation of the hexagonal form is (001). FIG. 2 is a graphical representation of the X-ray diffraction pattern of (100)Ni/(100)Cu/(100)Si structure. Only the (200) peaks are seen for both Ni and Cu, with no sign of the (111) peak of Ni. FIG. 3 is a graphical representation of the X-ray diffraction pattern of (100)Co/(100)Cu/(100)Si structure. The Co layer shows only the (200) peak, which is overlapping with the Cu (200) peak. To show the Co peak clearly, the sample is heated to 300° C. to completely consume the Cu reaction with Si. FIG. 4 is a graphical representation of the X-ray diffraction of the sample after heating, showing only the (200) peak of Co, with all the Cu present reacted to form Cu silicides.

Figure 5:
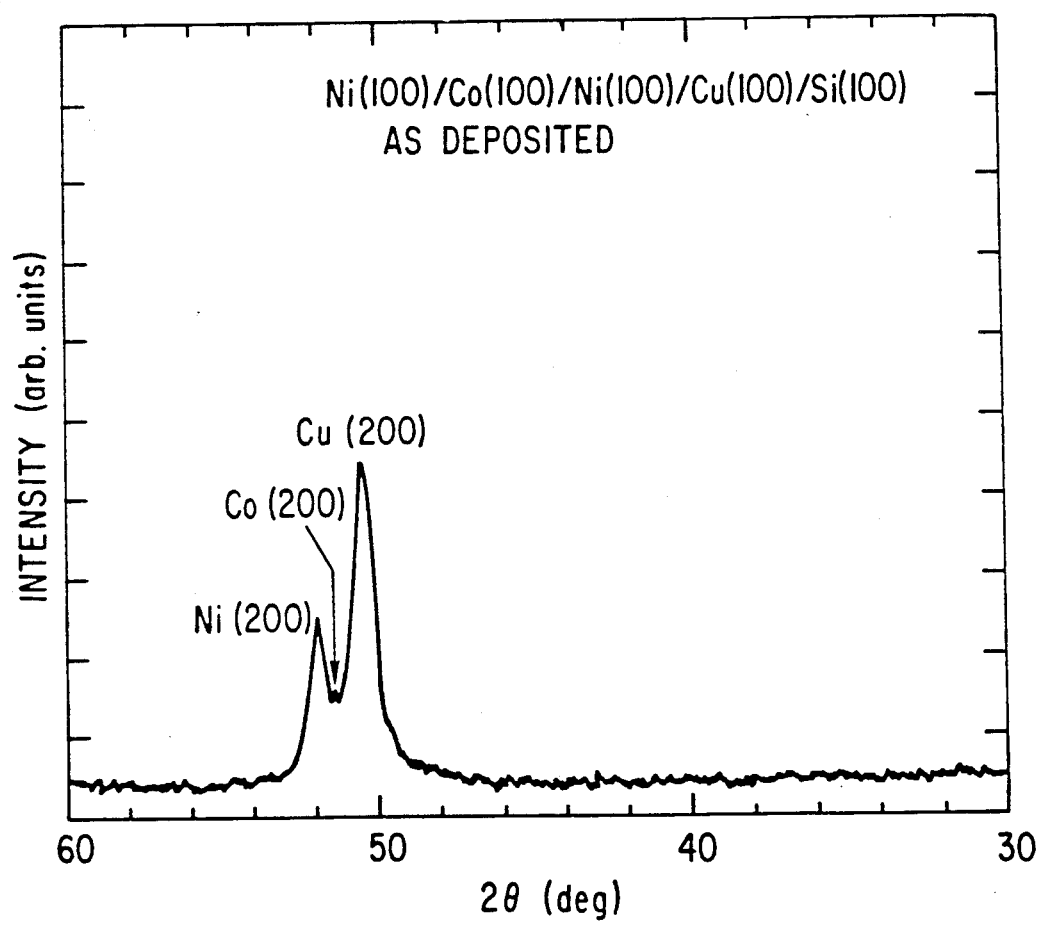
FIG. 5 is a graphical representation of an X-ray diffraction pattern of a Ni/Co/Ni/Cu/Si (100) structure manufactured in accordance with the present invention.
Figure 6:
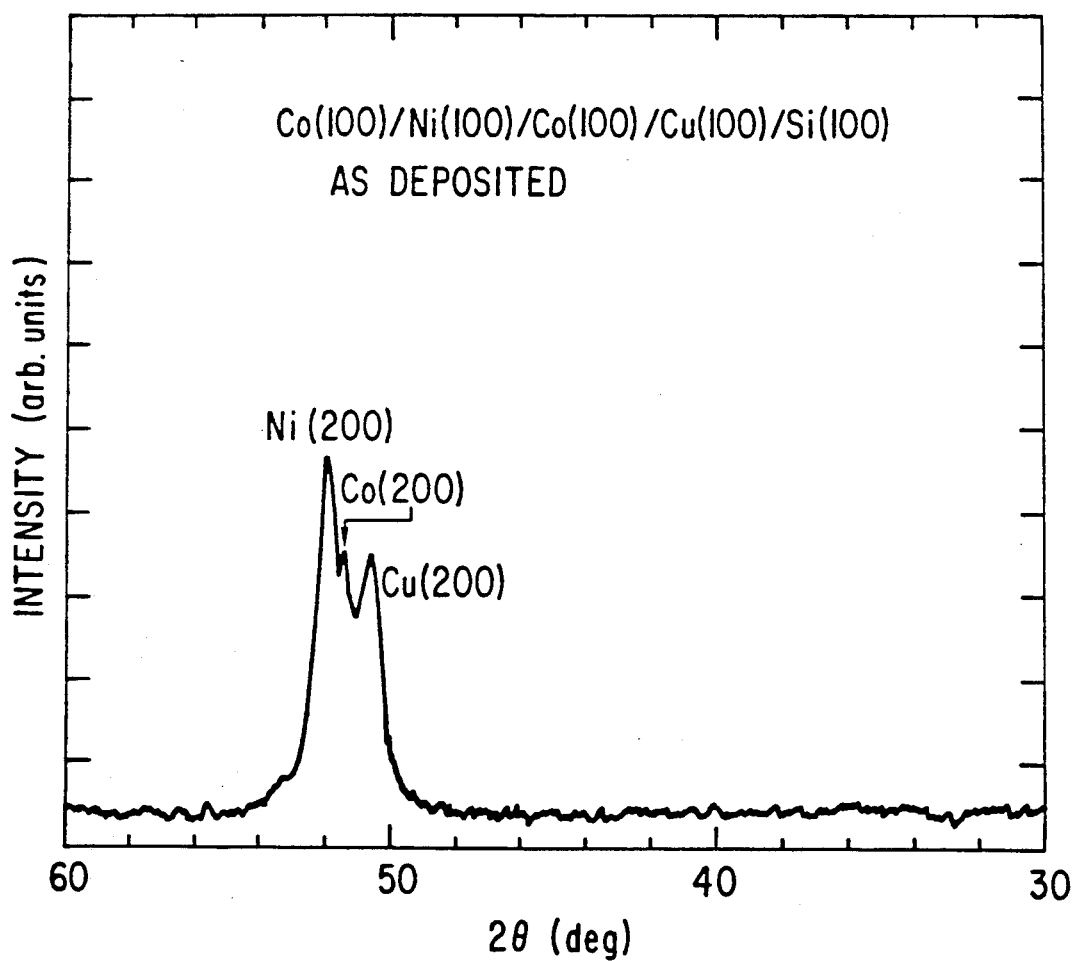
FIG. 6 is a graphical representation of an X-ray diffraction pattern of a Co/Ni/Co/Cu/Si (100) structure manufactured in accordance with the present invention.

Ni-Co alternate structures with controlled orientations are easily fabricated using the metal-metal epitaxy on silicon method. Specifically, Ni/Co/Ni/Cu/Si (100) and Co/Ni/Co/Cu/Si (100) structures have been manufactured and tested. Each metal layer is 100 Å thick. As shown in FIGS. 5 and 6, the X-ray diffraction analysis of the formed structure indicates (200) diffraction peaks of Cu, Ni and Co, without the detection of any (111) peaks. That is, there is complete epitaxy among all the deposited metal layers, each with (100) orientation. The success of depositing the Ni/Co/Ni alternate layers with controlled orientation allows fabrication of Ni/Co superlattices of the same orientation.

Figure 7:
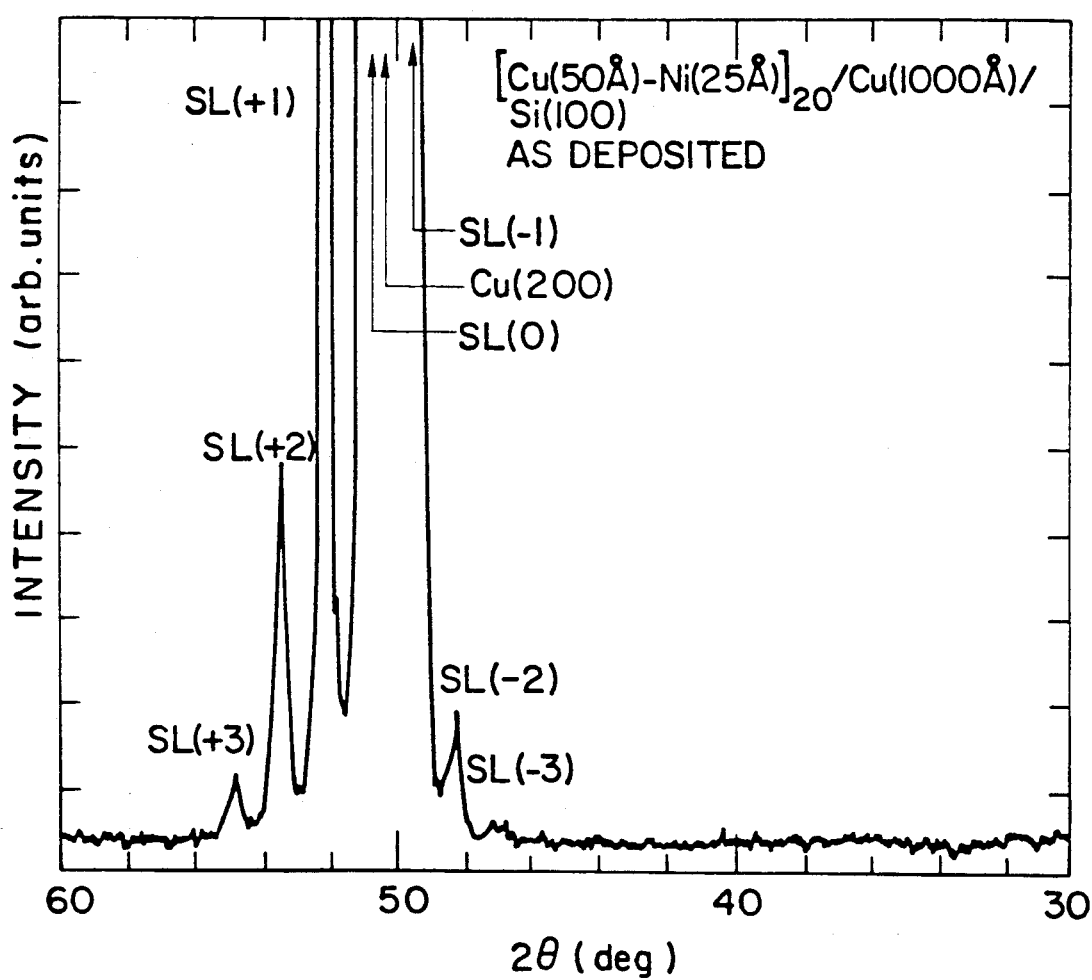
FIG. 7 is a graphical representation of an X-ray diffraction pattern of a Cu-Ni superlattice manufactured in accordance with the present invention.
Figure 8:
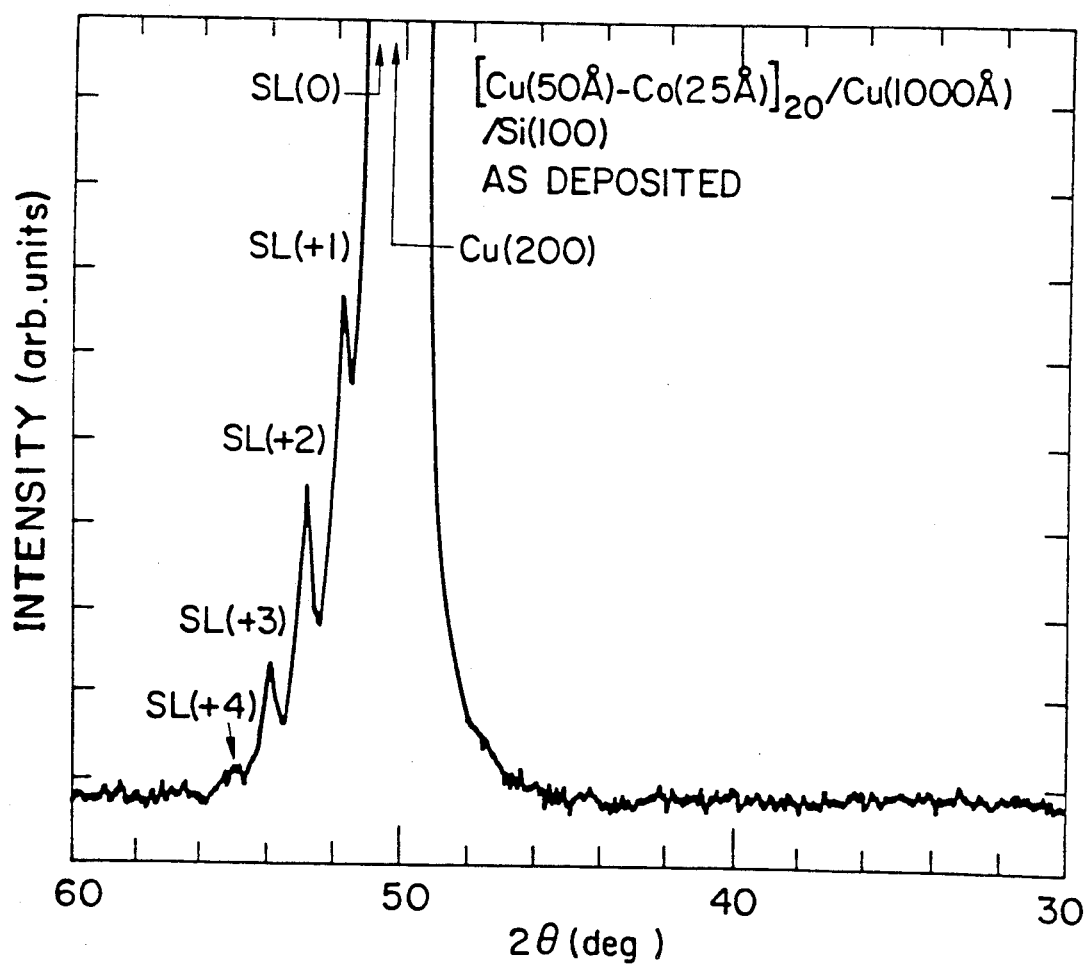
FIG. 8 is a graphical representation of an X-ray diffraction pattern of a Cu-Co superlattice manufactured in accordance with the present invention.
Figure 9:
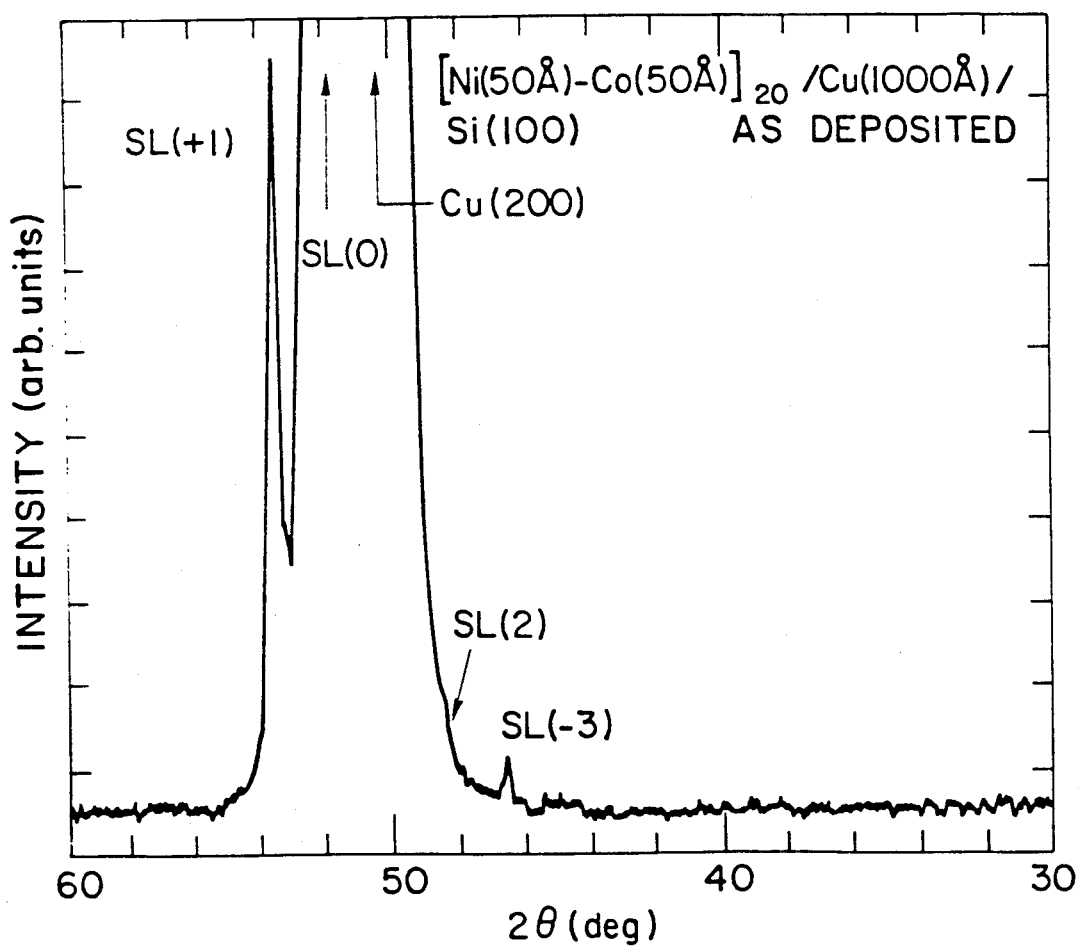
FIG. 9 is a graphical representation of an X-ray diffraction pattern of a Ni-Co superlattice manufactured in accordance with the present invention.

Epitaxial growth of ultra thin layer superlattices have also been made. FIGS. 7, 8 and 9 are graphical representations of Cu-Ni, Cu-Co and Ni-Co superlattices, respectively. FIG. 7 shows an X-ray diffraction pattern of the Cu-Ni superlattice [Cu(50 Å)-Ni(25 Å)]$_{20}$/Cu(1000 Å)/Si(100) as deposited. FIG. 8 shows an X-ray diffraction pattern of the Cu-Co superlattice [Cu(50 Å)-Co(25 Å)]$_{20}$/Cu(1000 Å)/Si(100) as deposited. FIG. 9 shows an X-ray diffraction pattern of the Ni-Co superlattice [Ni(50 Å)-Co(50 Å)]$_{20}$/Cu(1000 Å)/Si(100) as deposited. The graphs show well resolved satellite peaks due to the periodic structures present. Since the deposition is performed at room temperature, there is no reaction observed by the X-ray diffraction analysis.

The resultant metal film structures have a wide variety of applications. The magnetic metals such as Ni and Co, have application for both the thin individual layer and superlattice in magnetic application. The Cu-Ni, Cu-Co and Ni-Co superlattices have shown magnetic properties which are clearly dependent upon orientation.

The deposition method is not limited to electron beam evaporation, but other evaporation techniques as is known in the art are also useful in practicing the current invention. Such techniques include sputtering and low temperature chemical vapor deposition.

Figure 10:
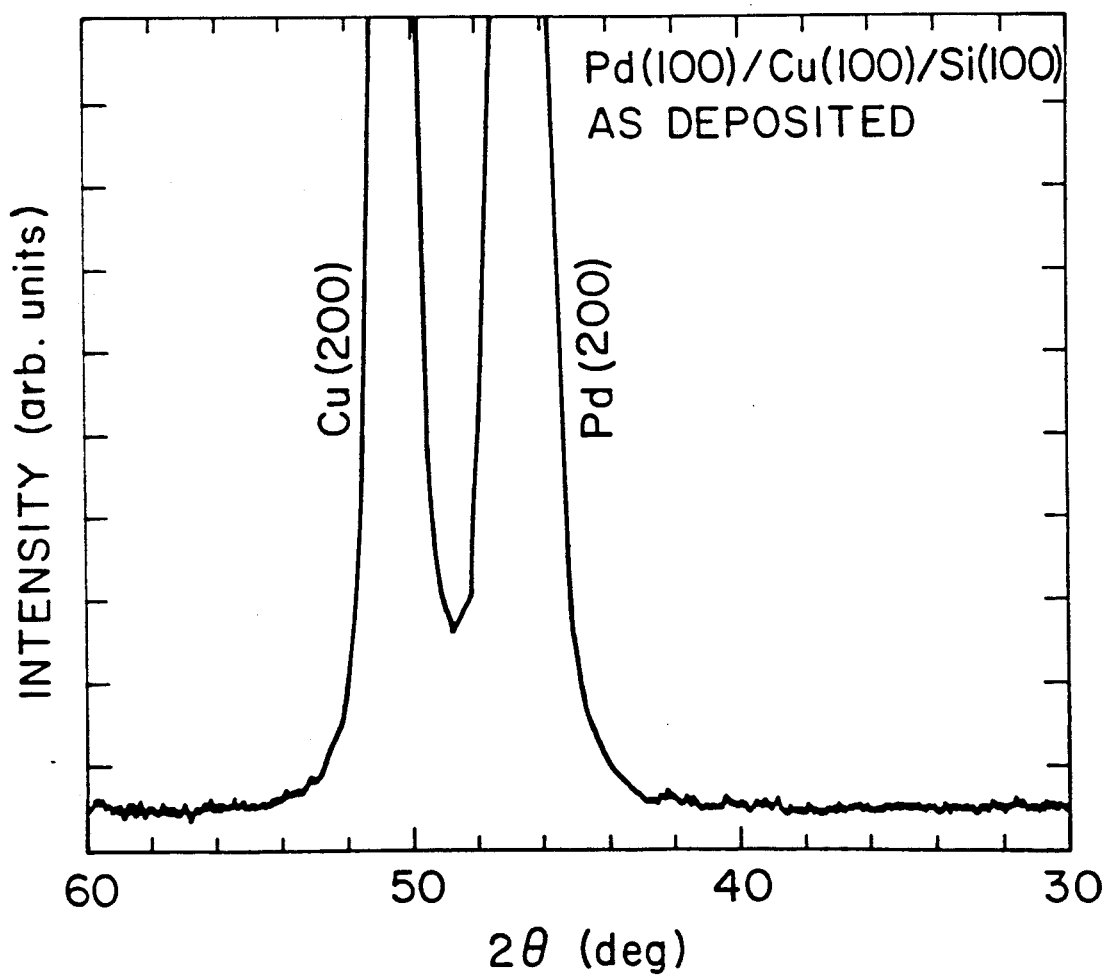
FIG. 10 is a graphical representation of an X-ray diffraction pattern of a Pd(100)/Cu(100)/Si(100) structure manufactured in accordance with the present invention.
Figure 11:
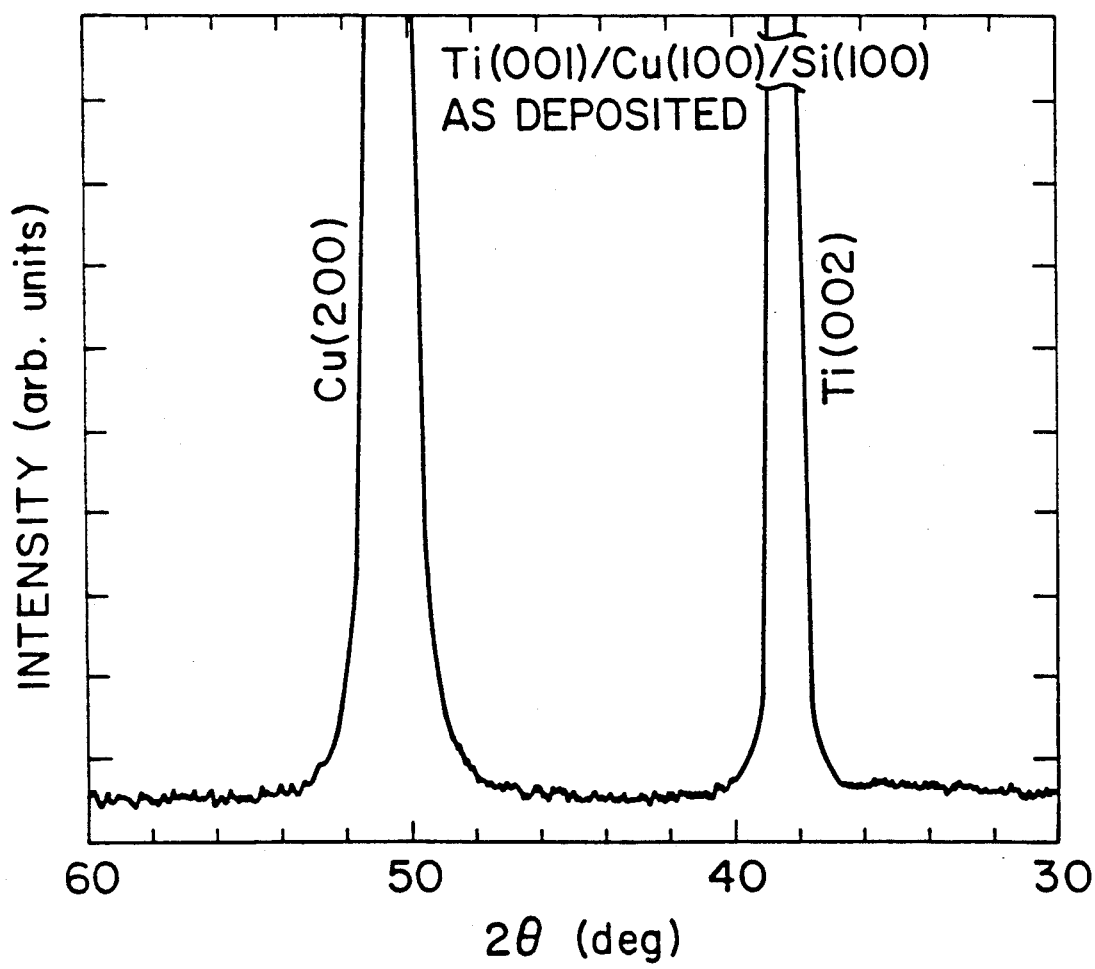
FIG. 11 is a graphical representation of an X-ray diffraction pattern of a Ti(001)/Cu(100)/Si(100) structure manufactured in accordance with the present invention.

As described above, the present invention permits deposition of oriented titanium and palladium using the same electron beam evaporation at low vacuum without applying external heating. A 1000 Å thick layer of Cu is deposited on a single crystalline silicon wafer. The (100)Cu film deposited on (100)Si allows for the deposition of (100)Pd in cubic form or (001)Ti in hexagonal form. Using deposition methods other than the present invention normally results in the deposition of Pd film in a (111) preferred orientation on (100)Si and Ti is usually in hexagonal form with the much less preferred (001) orientation. FIGS. 10 and 11 are graphical representations of the (100)Pd and (001)Ti films deposited according to the present invention. FIGS. 10 shows an X-ray diffraction pattern of Pd(100) film as deposited on Cu(100)/Si(100), showing only the (200) diffraction peak of Pd. FIG. 11 shows an X-ray diffraction pattern of Ti film as deposited on Cu(100)/Si(100), showing only the (002) diffraction peak of Ti.

The deposition of Ti and Pd films at room temperature with controlled orientation in a conventional chamber is particularly advantageous for manufacturing. The deposition of alternating Ti and Cu layers, alternating Pd and Cu layers, and layers of Ti, Pd, Cu and other metal layers such as Ni and Co expitaxially grown on Cu, all with controlled orientation, are particularly useful for the fabrication of magnetic storage devices.

Figure 12:
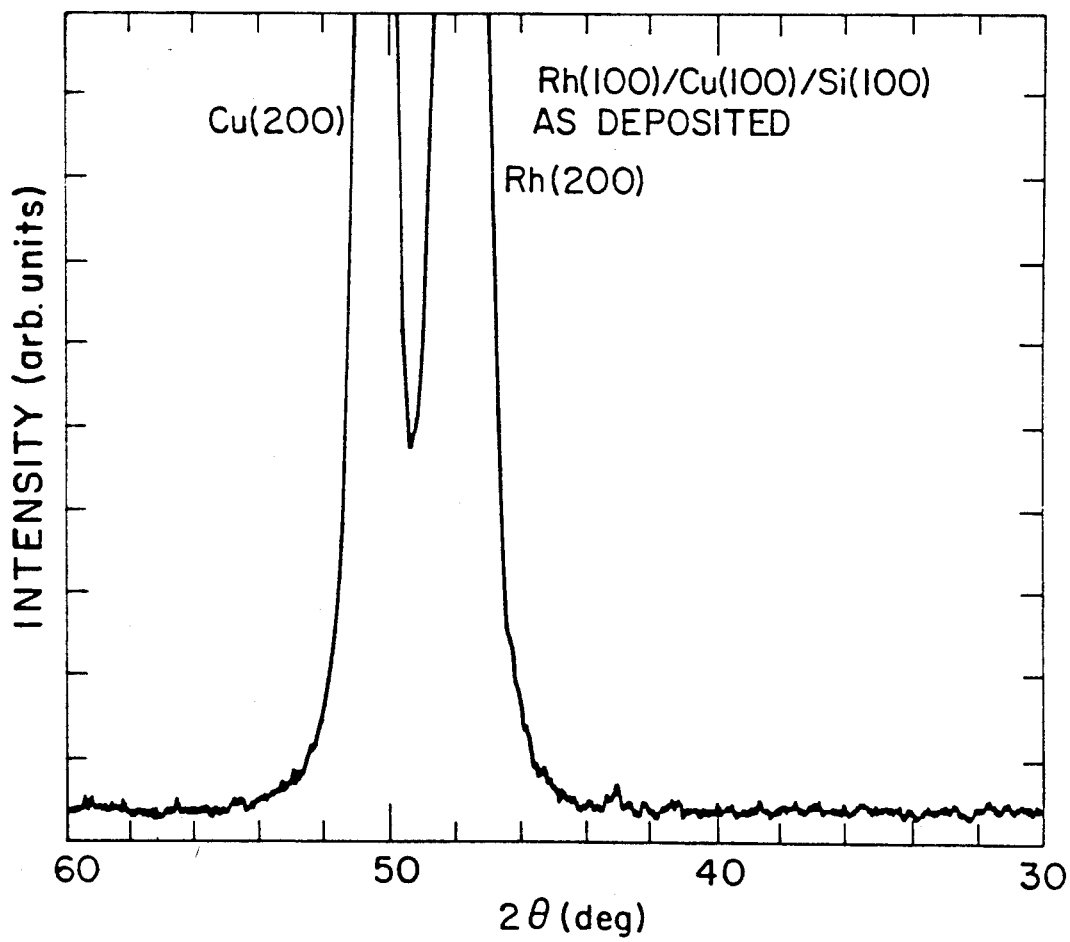
FIG. 12 is a graphical representation of an X-ray diffraction pattern of a Rh(100)/Cu(100)/Si(100) structure manufactured in accordance with the present invention.
Figure 13:
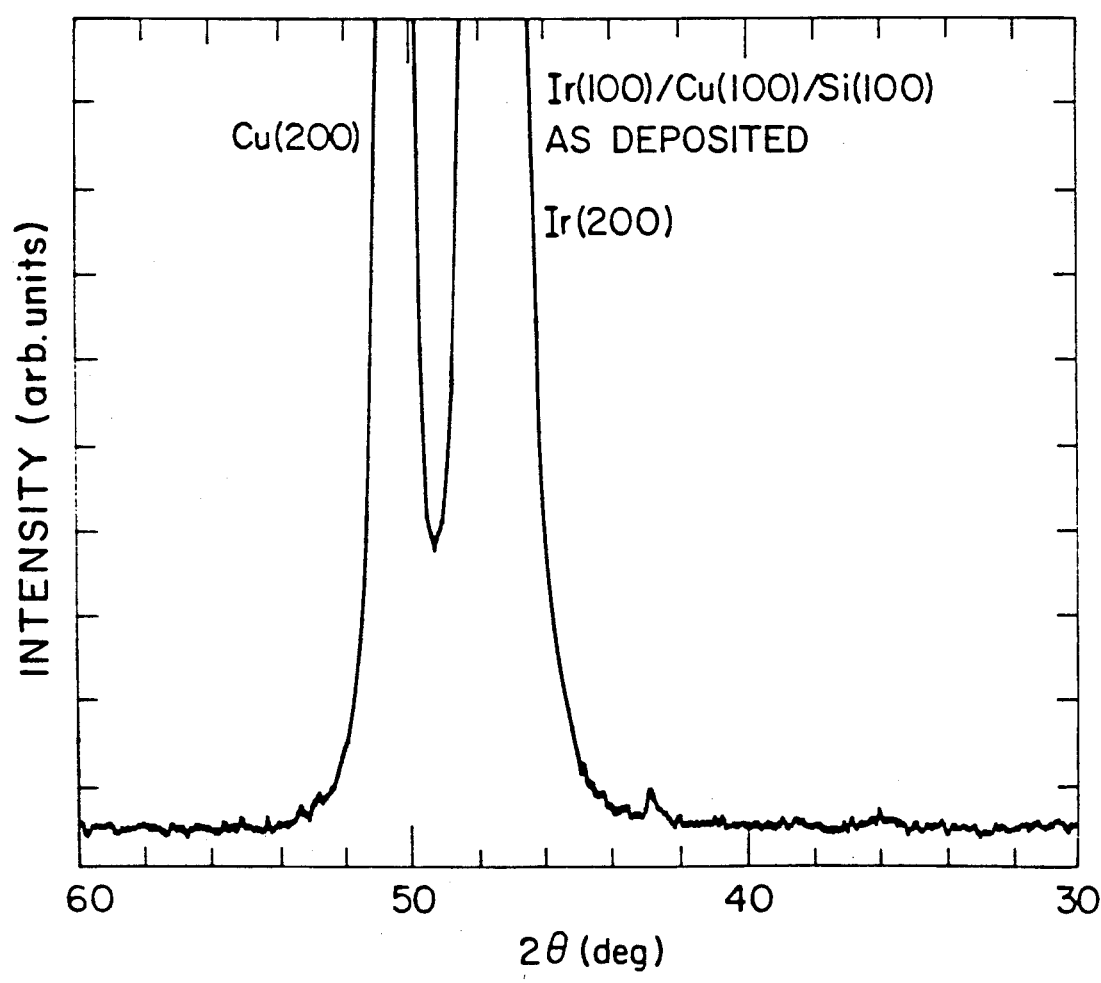
FIG. 13 is a graphical representation of an X-ray diffraction pattern of (100)Ir/(100)Cu/(100)Si structure manufactured in accordance with the present invention.

In the field of catalysis, metal such as rhodium and iridium are of particular interest. Single crystals are used to control the requisite orientation. Thin layers of Rh and Ir, approximately 1000 angstrom thick, were deposited on Cu film which had previously been epitaxially deposited on single crystal Si wafers. The entire deposition process of the Cu layer and Rh layer, as well as the Cu layer and Ir layer, were performed without removing the vacuum. No intentional heating is applied to the substrates during the deposition process. Using (100)Si wafers resulted in the deposition of (100)Rh and (100)Ir films. FIG. 12 is an X-ray diffraction pattern of Rh(100)/Cu(100)/Si(100) structure which shows only (200) diffraction peaks of the Rh and Cu. FIG. 13 is an X-ray diffraction pattern of a Ir(100)/Cu(100)/Si(100) structure which shows only the (200) diffraction peaks of the Ir and Cu. When (111) Si wafer is used as the substrate, (111) metal films are deposited.

The growing of Rh and Ir films with controlled orientations has many advantages in catalysis application. The present invention results in metal films which are smooth and shiny eliminating tedious in situ cleaning and annealing of the substrate surface. The film deposition process is lower cost than the use of single crystal Rh and Ir. It is possible to grow other alternate film layers as needed without changing the substrate and without removing the vacuum.

Figure 1B:
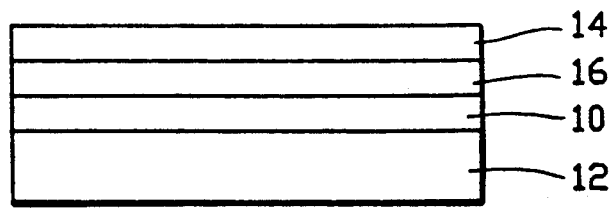
FIG. 1B is a side elevation view of an alternate preferred embodiment of a four layer metal-metal epitaxy structure on a substrate.
Figure 14:
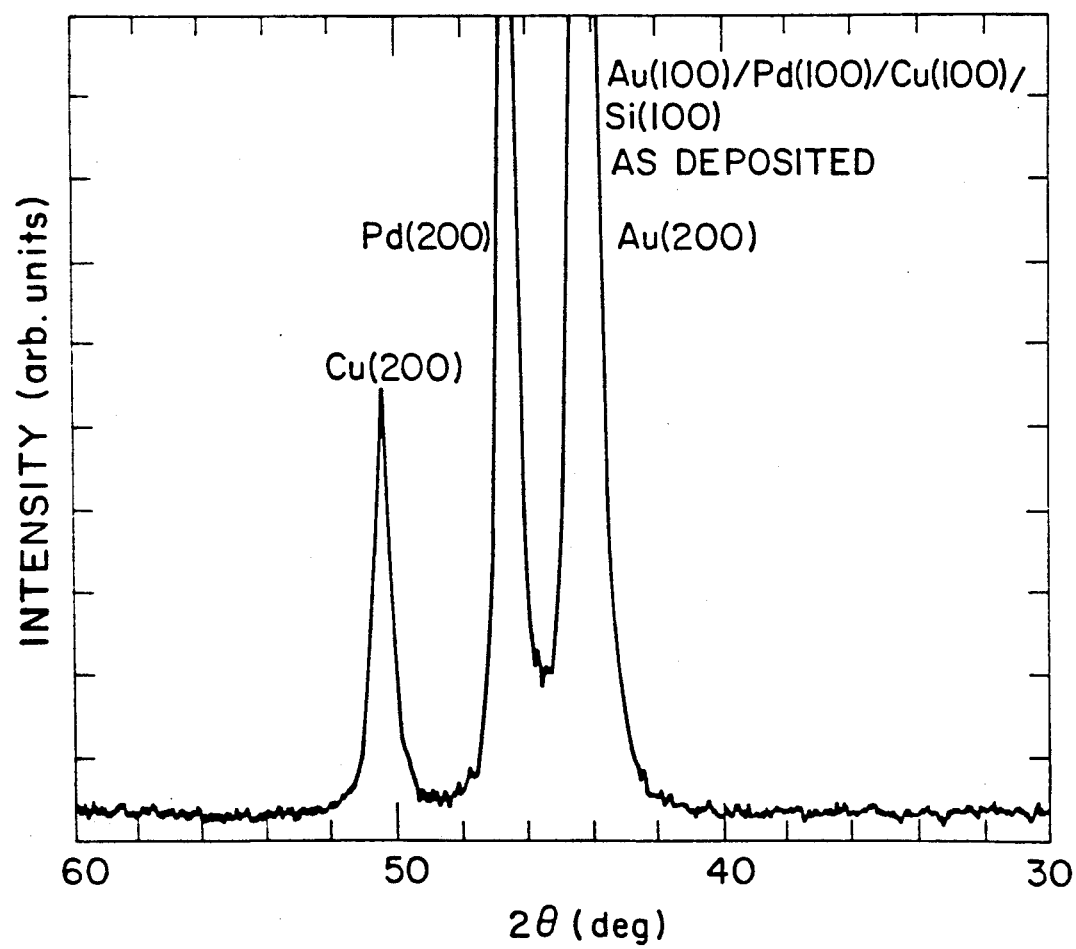
FIG. 14 is a graphical representation of an X-ray diffraction pattern of (100)Au/(100)Pd/(100)Cu/(100)Si structure manufactured in accordance with the present invention.
Figure 15:
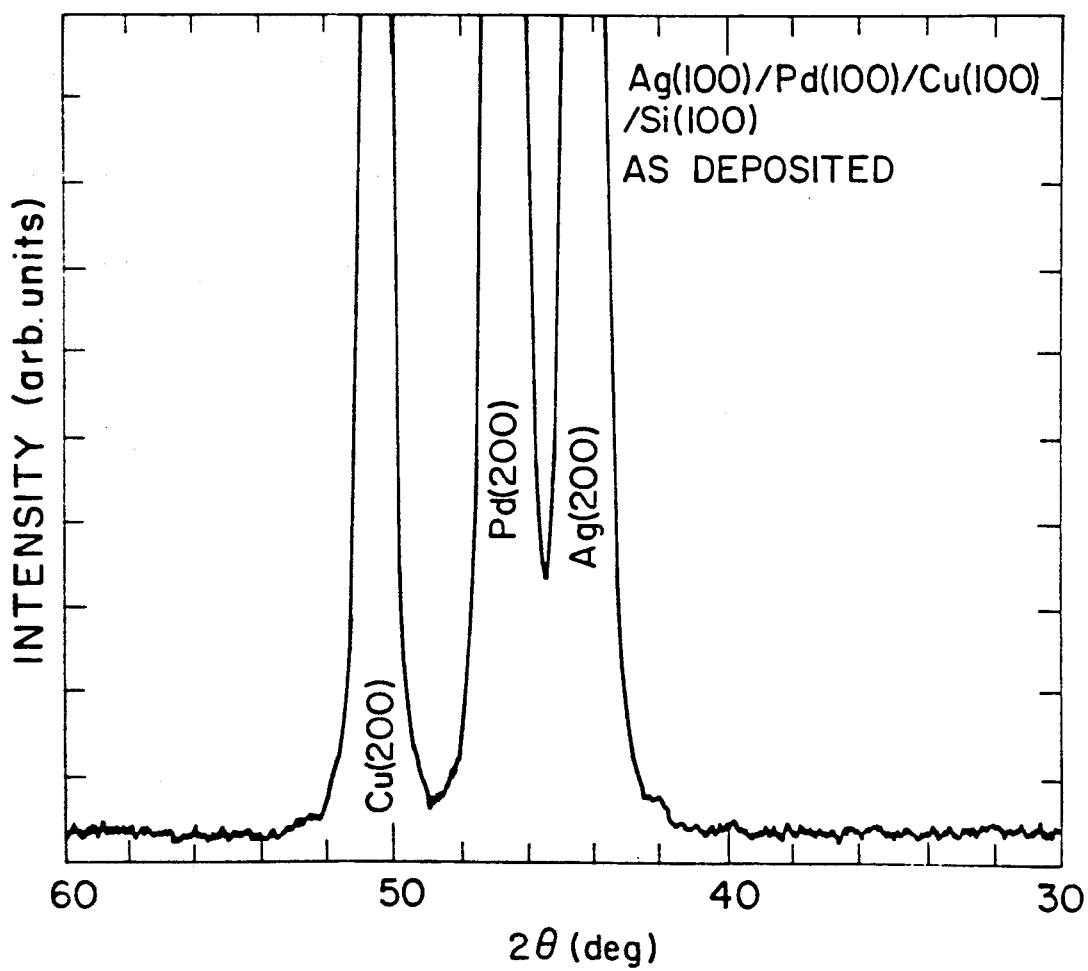
FIG. 15 is a graphical representation of an X-ray diffraction pattern of (100)Ag/(100)Pd/(100)Cu/(100)Si structure manufactured in accordance with the present invention.
Figure 16:
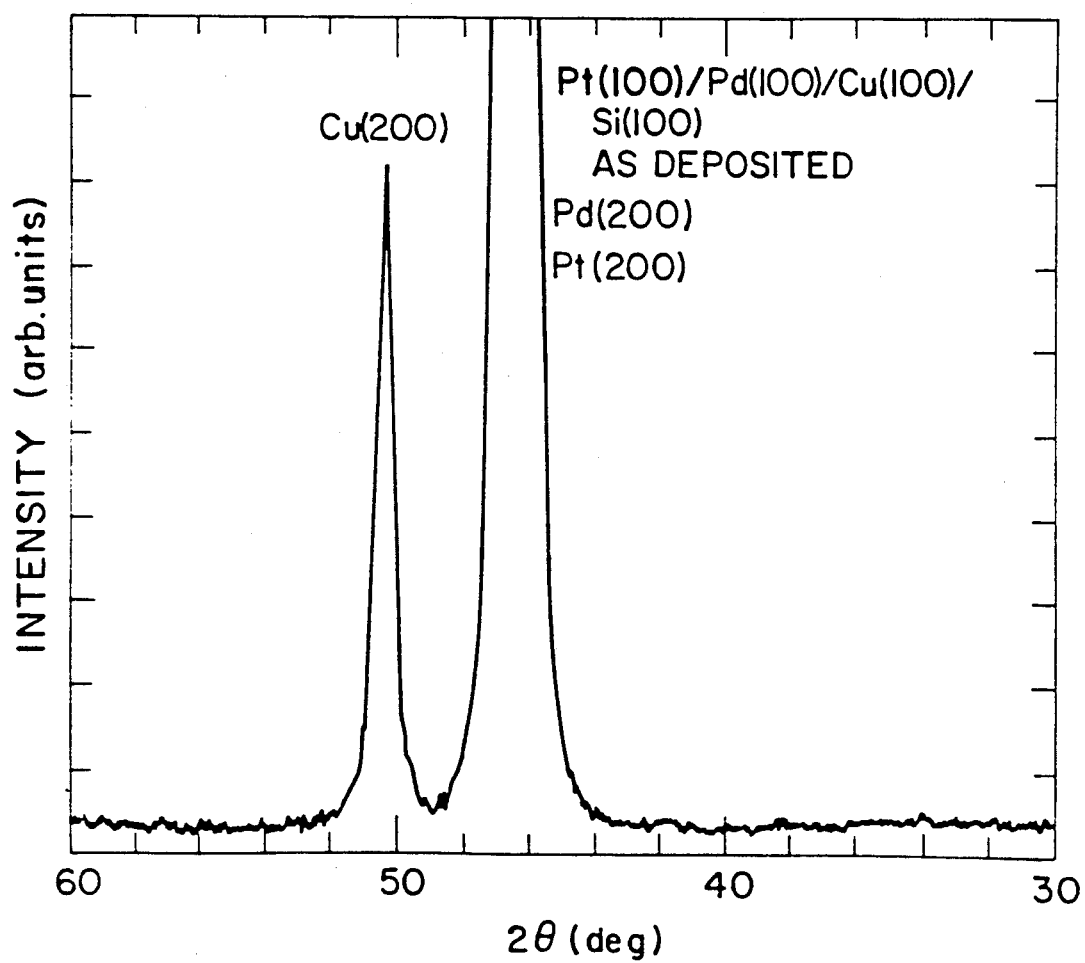
FIG. 16 is a graphical representation of an X-ray diffraction pattern of a (100)Pt/(100)Pd/(100)Cu/(100)Si structure manufactured in accordance with the present invention.

Certain other metals do not exhibit an epitaxial relation with copper due to a lack of a lattice match. Among these metals are gold, silver, platinum, iron, vanadium and chromium. When depositing layers of these metals, as shown in FIG. 1B, instead of using epitaxial Cu 10 as the seeding layer on the silicon wafer 12, an epitaxial Pd layer 16 is grown onto the Cu layer 10 to provide a suitable lattice match of adjoining metal layers before depositing the other metal layer 14. The Pd layer 16 provides a seed having a better lattice match with the other metals of interest. FIG. 14 shows an X-ray diffraction pattern of Au(100)/Pd(100)/Cu(100)/Si(100) which shows only the (200) diffraction peaks of the metals. FIG. 15 shows an X-ray diffraction pattern of Ag(100)/Pd/(100)/Cu(100)/Si(100) which shows only the (200) diffraction peaks of the metals. Similar epitaxial growth (100) oriented Pt films has been obtained, as shown in FIG. 16. However, due to the overlap of the (200) diffraction peaks of Pt with that of Pd, the (200) peaks are not resolvable with the instrumentation used.

Figure 17:
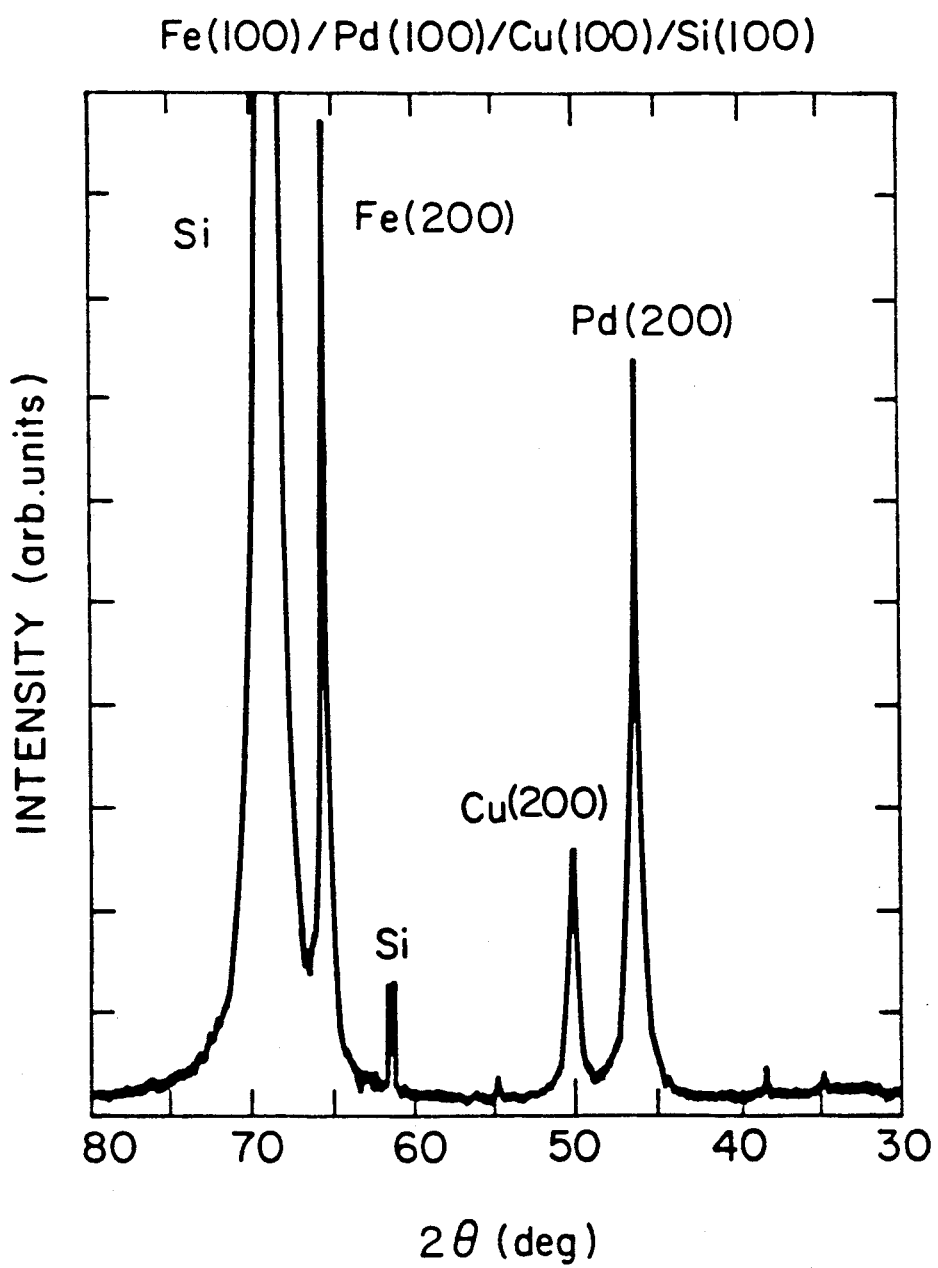
FIG. 17 is a graphical representation of an X-ray diffraction pattern of (100)Fe/(100)Pd/(100)Cu/(100)Si structure manufactured in accordance with the present invention.
Figure 18:
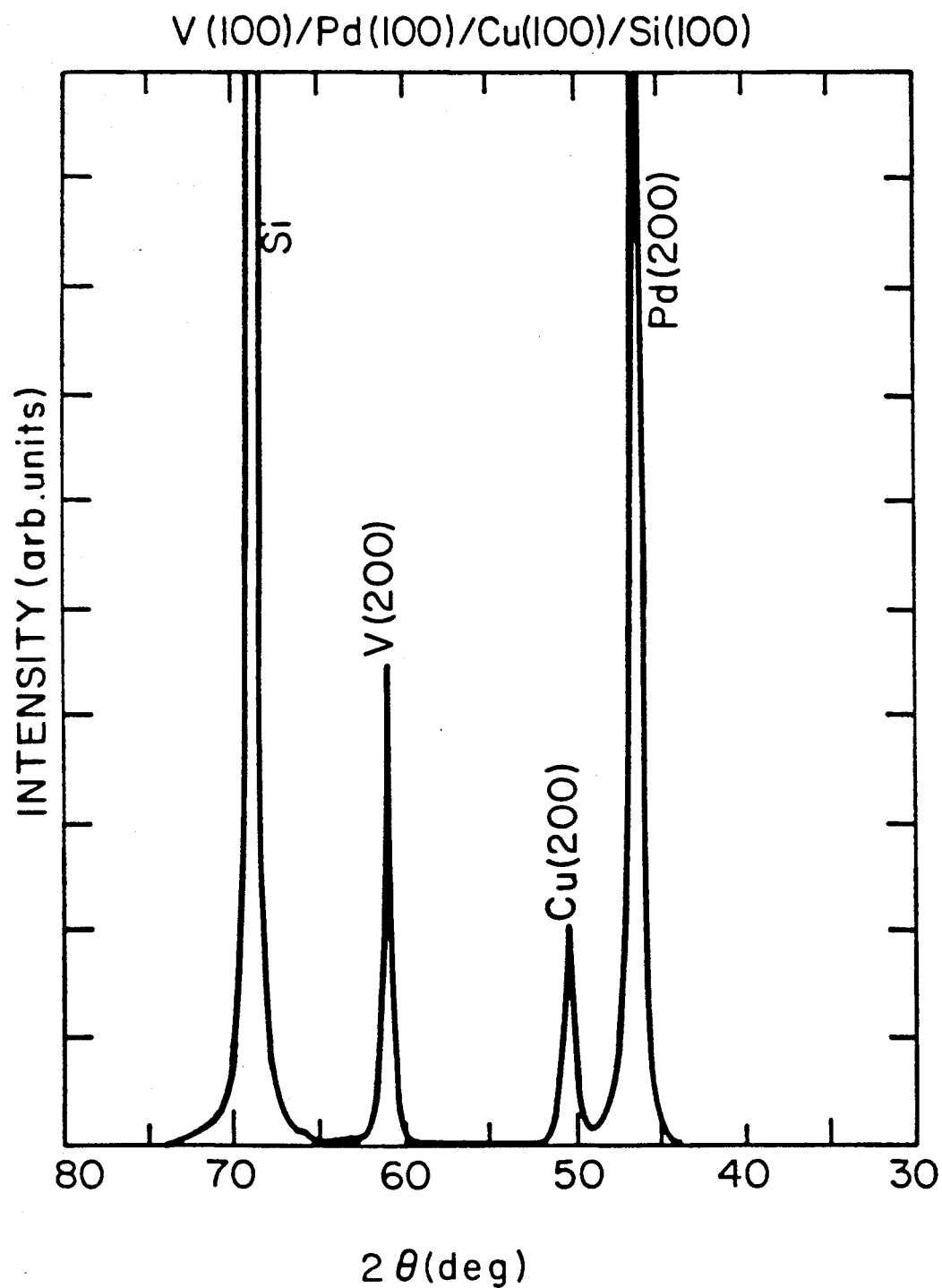
FIG. 18 is a graphical representation of an X-ray diffraction pattern of (100)V/(100)Pd/(100)Cu/(100)Si structure manufactured in accordance with the present invention.
Figure 19:
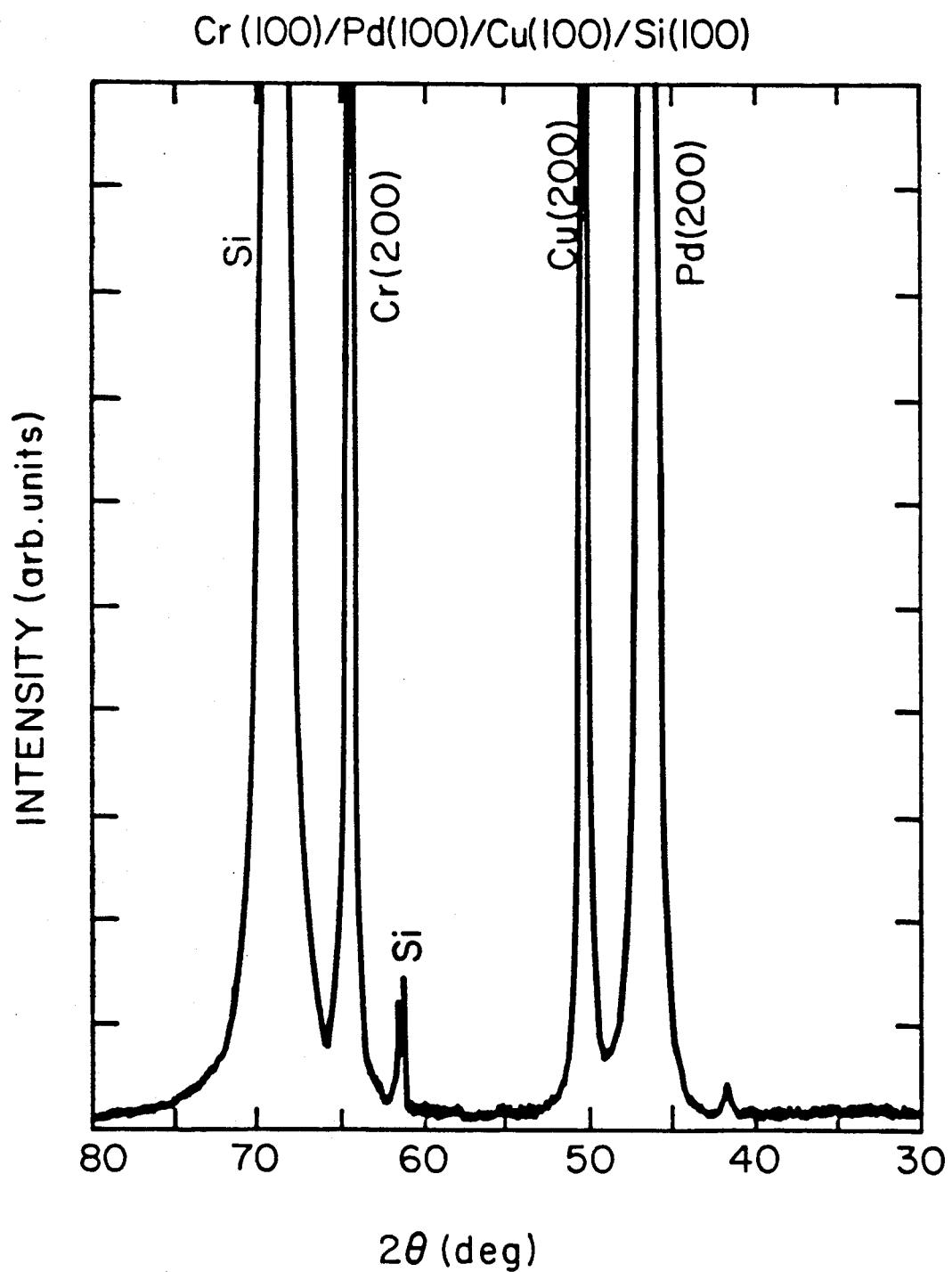
FIG. 19 is a graphical representation of an X-ray diffraction pattern of (100)Cr/(100)Pd/(100)Cu/(100)Si structure manufactured in accordance with the present invention.

The diffraction patterns for the epitaxial growth of (100) Fe, V and Cr on the (100)Pd/(100)Cu/(100)Si structures are shown in FIGS. 17-19. FIG. 17 shows the (100)Fe/(100)Pd/(100)Cu/(100)Si structure; FIG. 18 shows the (100)V/(100)Pd/(100)Cu/(100)Si structure; and FIG. 19 shows the (100)Cr/(100)Pd/(100)Cu/(100)Si structure. Only the (200) peaks are detected for Fe, V and Cr in these structures. This is especially significant in that these metals are all body-centered cubic, where the preferred orientation is the (110) orientation.

Tungsten and molybdenum have been found not to epitaxially grow on the palladium layer. However, the interposition of an epitaxially grown gold layer on the palladium layer permits subsequent epitaxial growth of tungsten and molybdenum on the gold layer.

Figure 20:
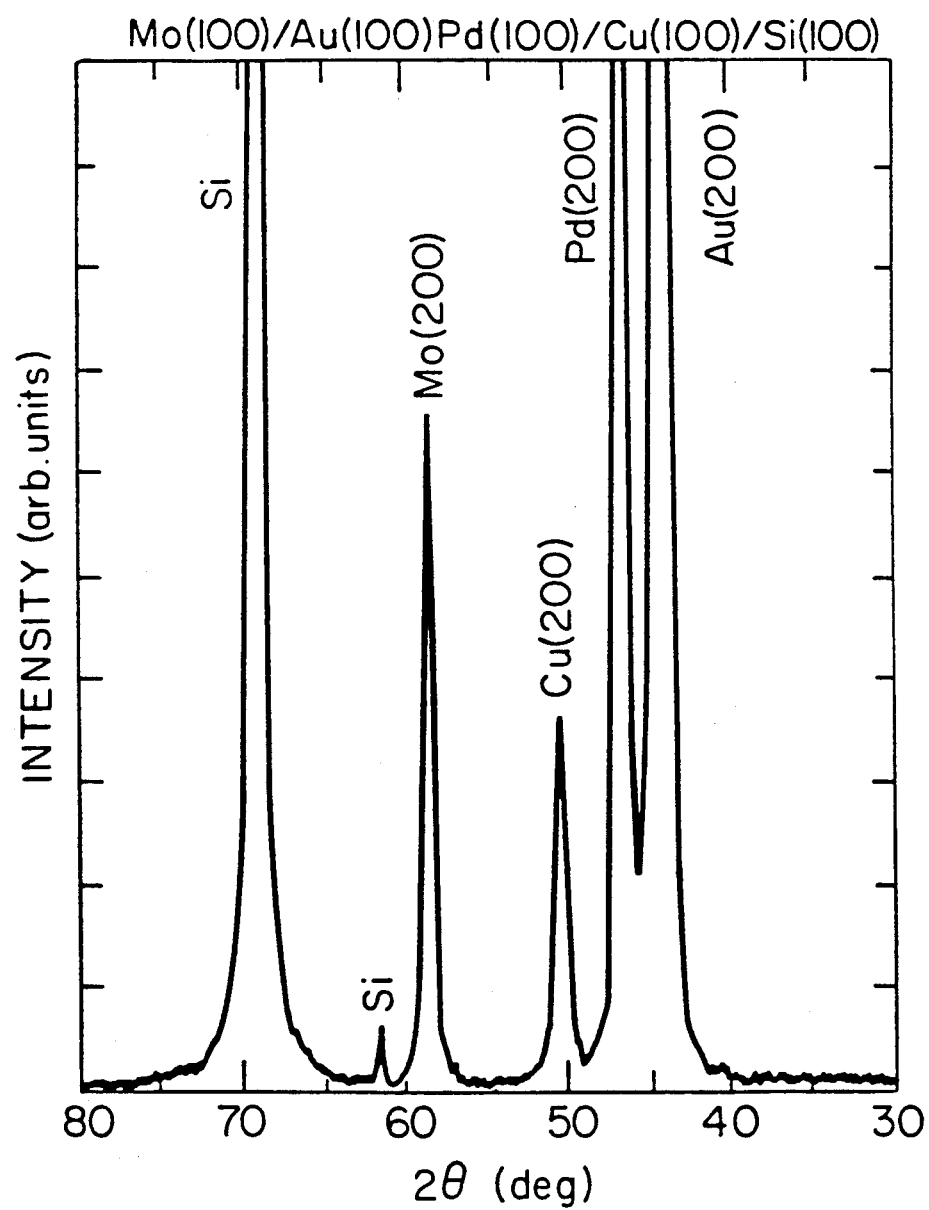
FIG. 20 is a graphical representation of an X-ray diffraction pattern of a (100)Mo/(100)Au/(100)Pd/(100)Cu/(100)Si structure manufactured in accordance with the present invention.
Figure 21:
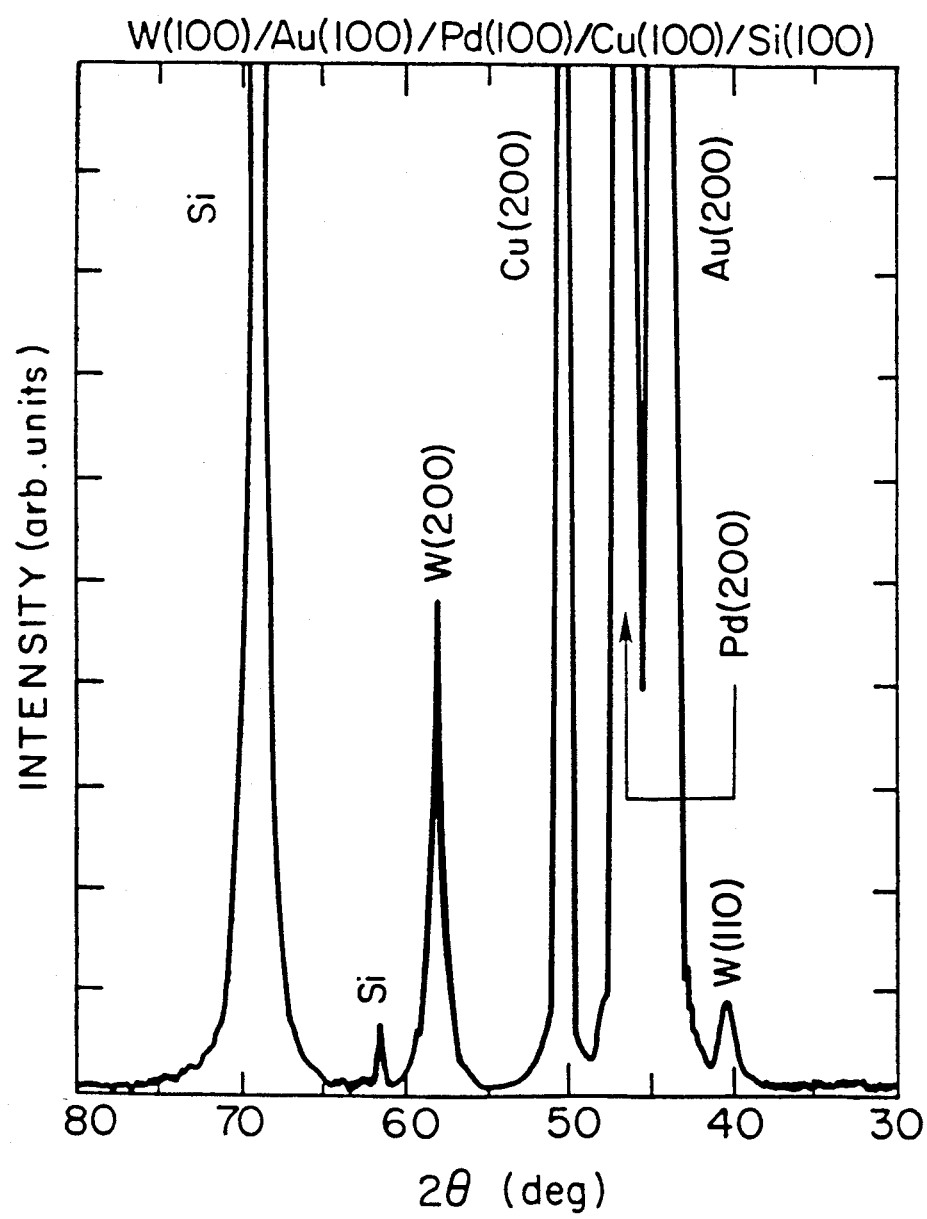
FIG. 21 is a graphical representation of an X-ray diffraction pattern of (100)W/(100)Au/(100)Pd/(100)Cu/(100)Si structure manufactured in accordance with the present invention.
Figure 22:
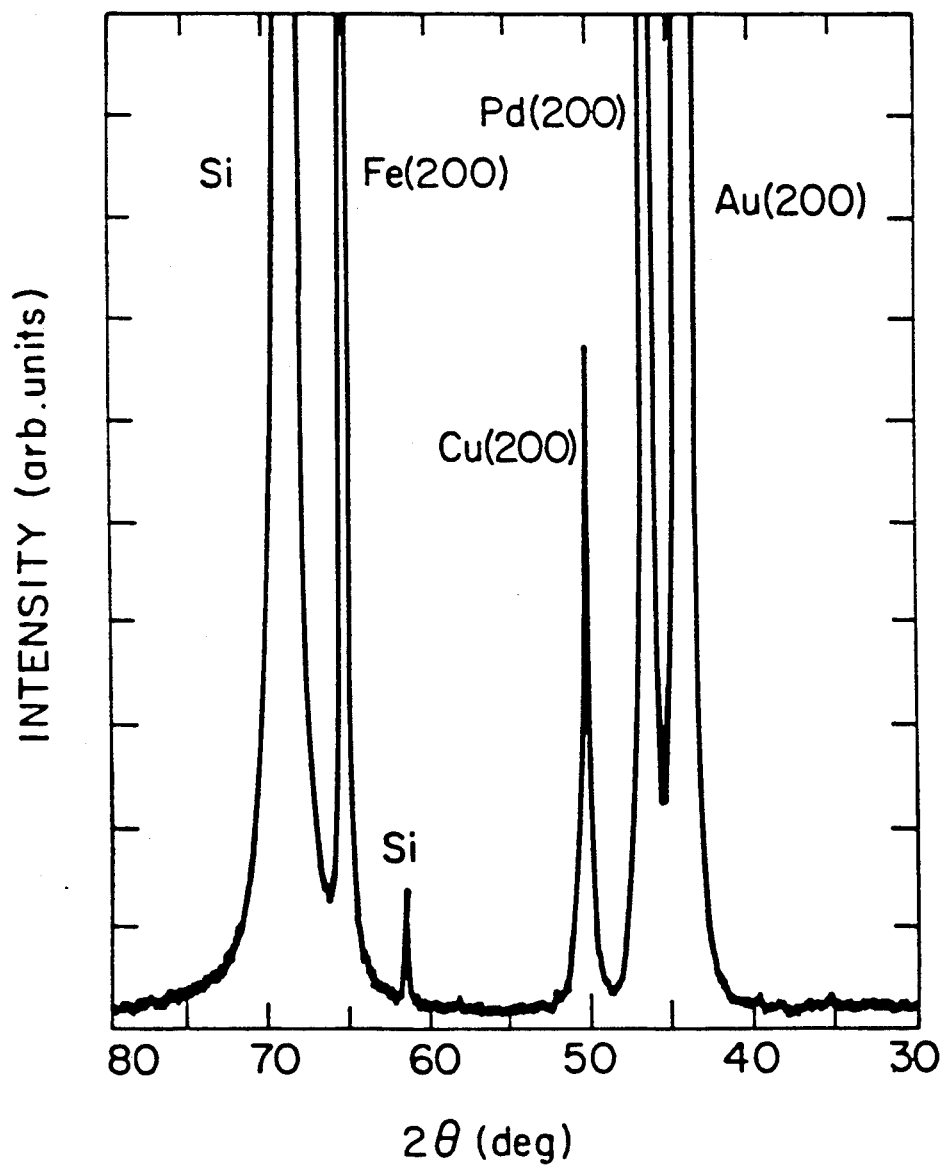
FIG. 22 is a graphical representation of an X-ray diffraction pattern of (100)Fe/(100)Au/(100)Pd/(100)Cu/(100)Si structure manufactured in accordance with the present invention.
Figure 23:
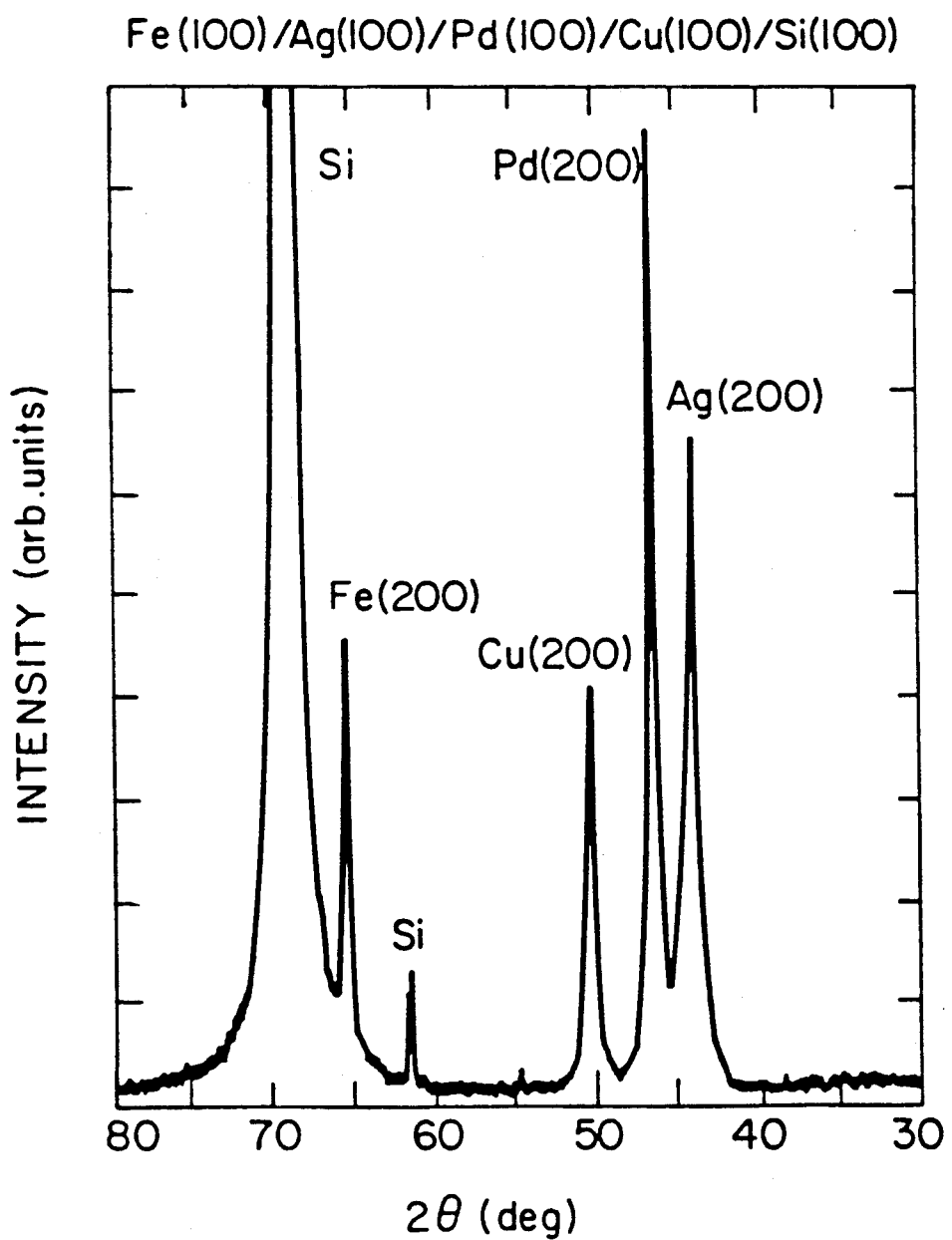
FIG. 23 is a graphical representation of an X-ray diffraction pattern of (100)Fe/(100)Ag/(100)Pd/(100)Cu/(100)Si structure manufactured in accordance with the present invention.
Figure 24:
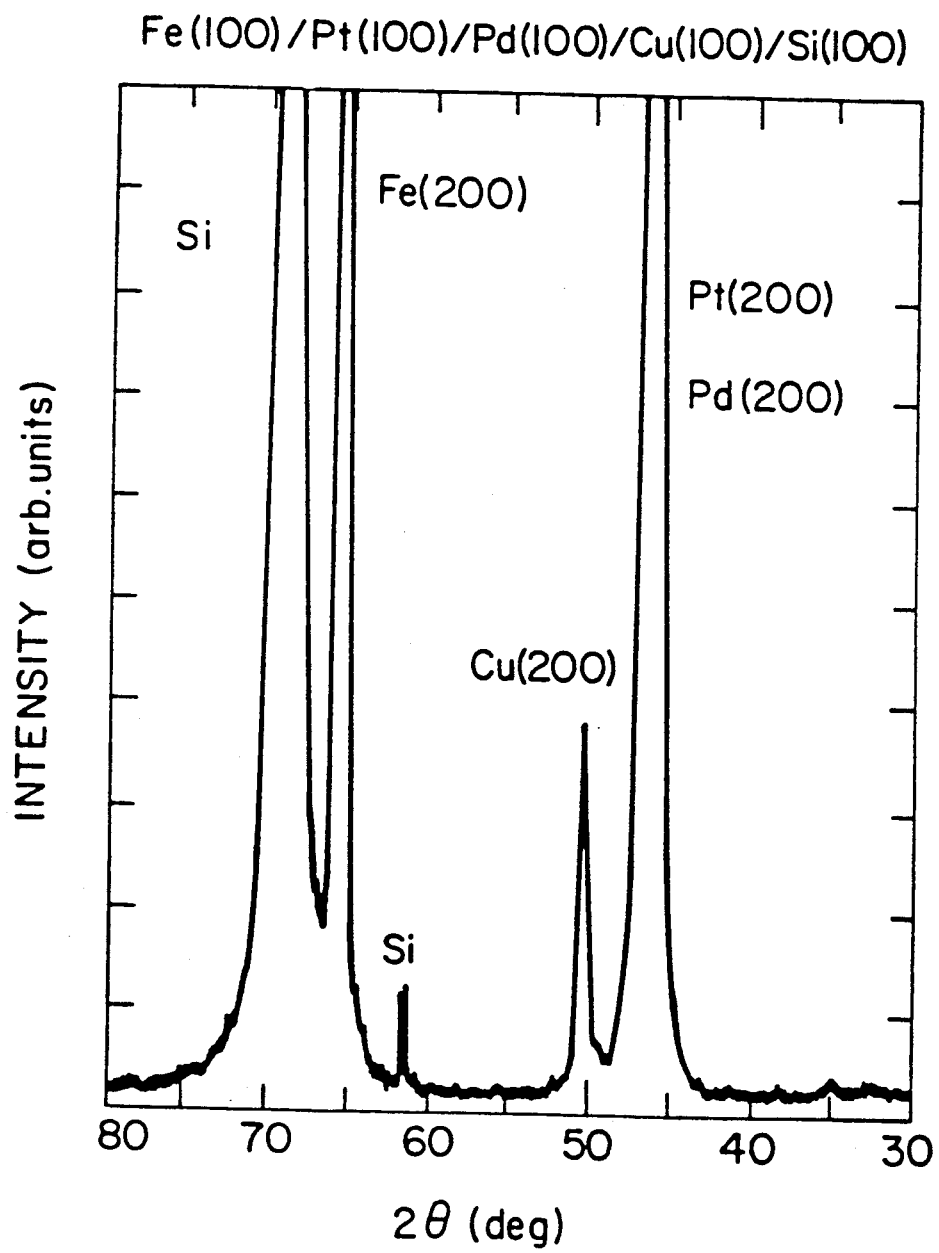
FIG. 24 is a graphical representation of an X-ray diffraction pattern of a (100)Fe/(100)Pt/(100)Pd/(100)Cu/(100)Si structure manufactured in accordance with the present invention.
Figure 25:
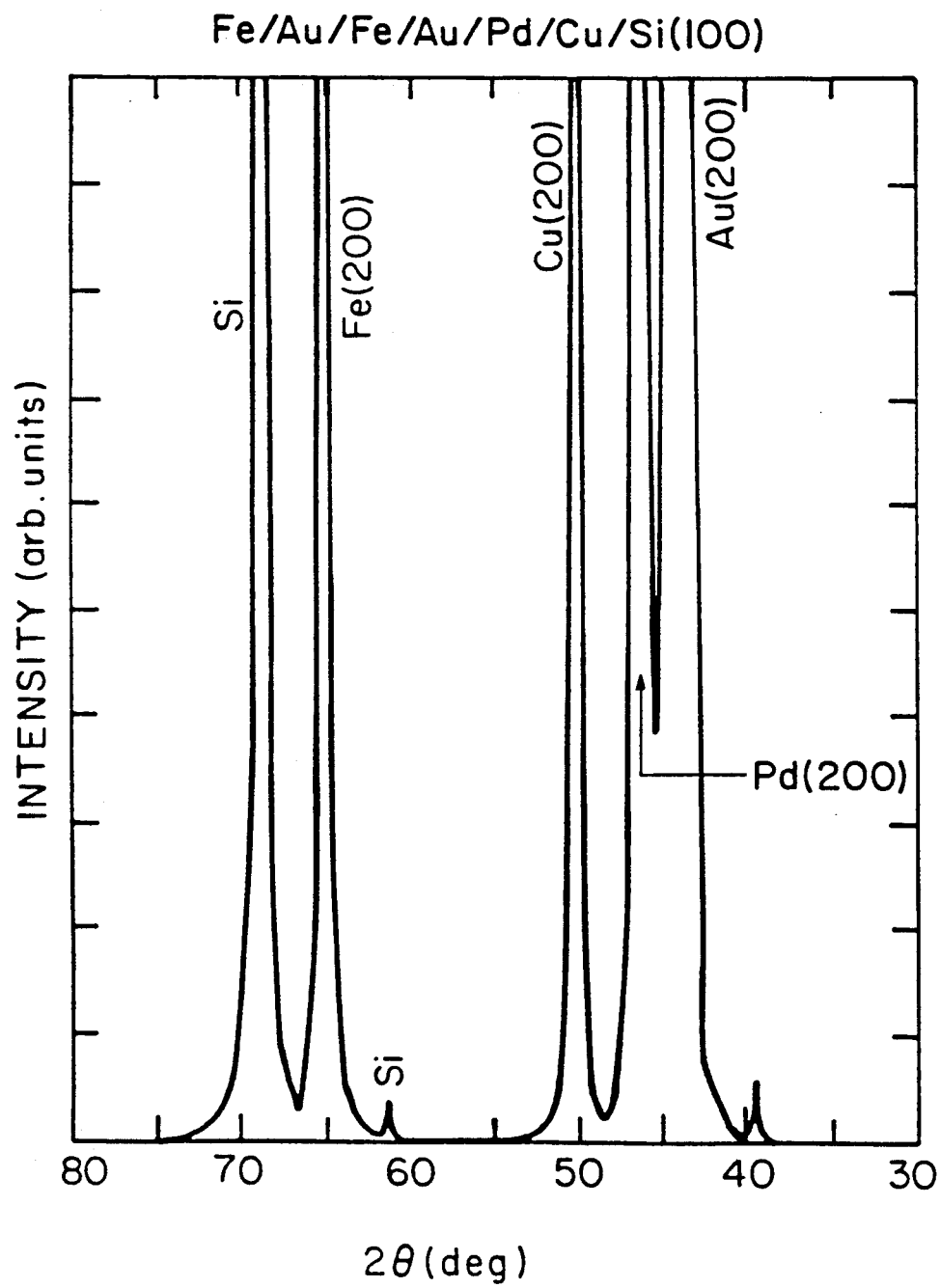
FIG. 25 is a graphical representation of an X-ray diffraction pattern of (100)Fe/(100)Au/(100)Fe/(100)Au/(100)Pd/(100)Cu/(100)Si structure manufactured in accordance with the present invention.
Figure 26:
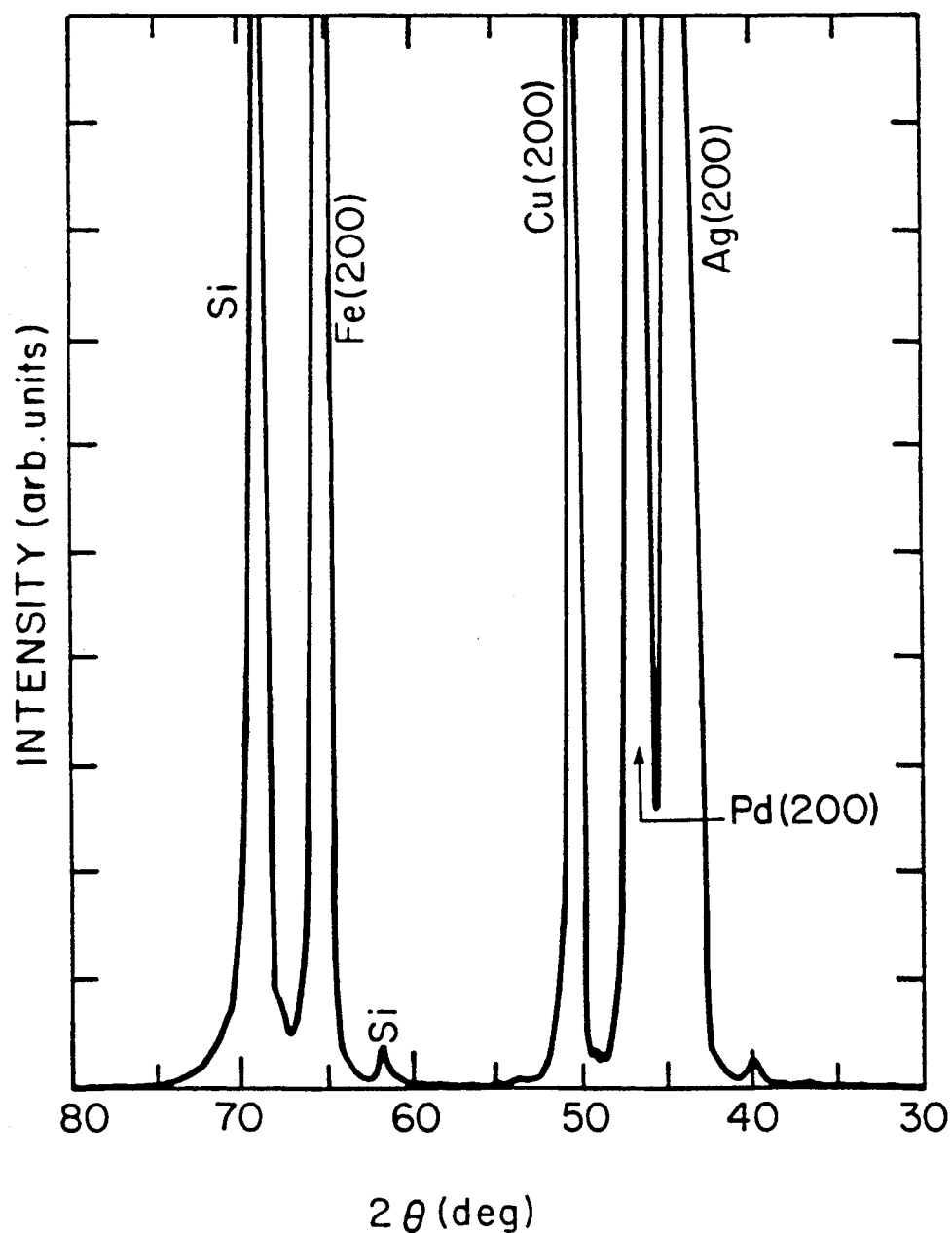
FIG. 26 is a graphical representation of an X-ray diffraction pattern of (100)Fe/(100)Ag/(100)Fe/(100)Ag/(100)Pd/(100)Cu/(100)Si structure manufactured in accordance with the present invention.
Figure 27:
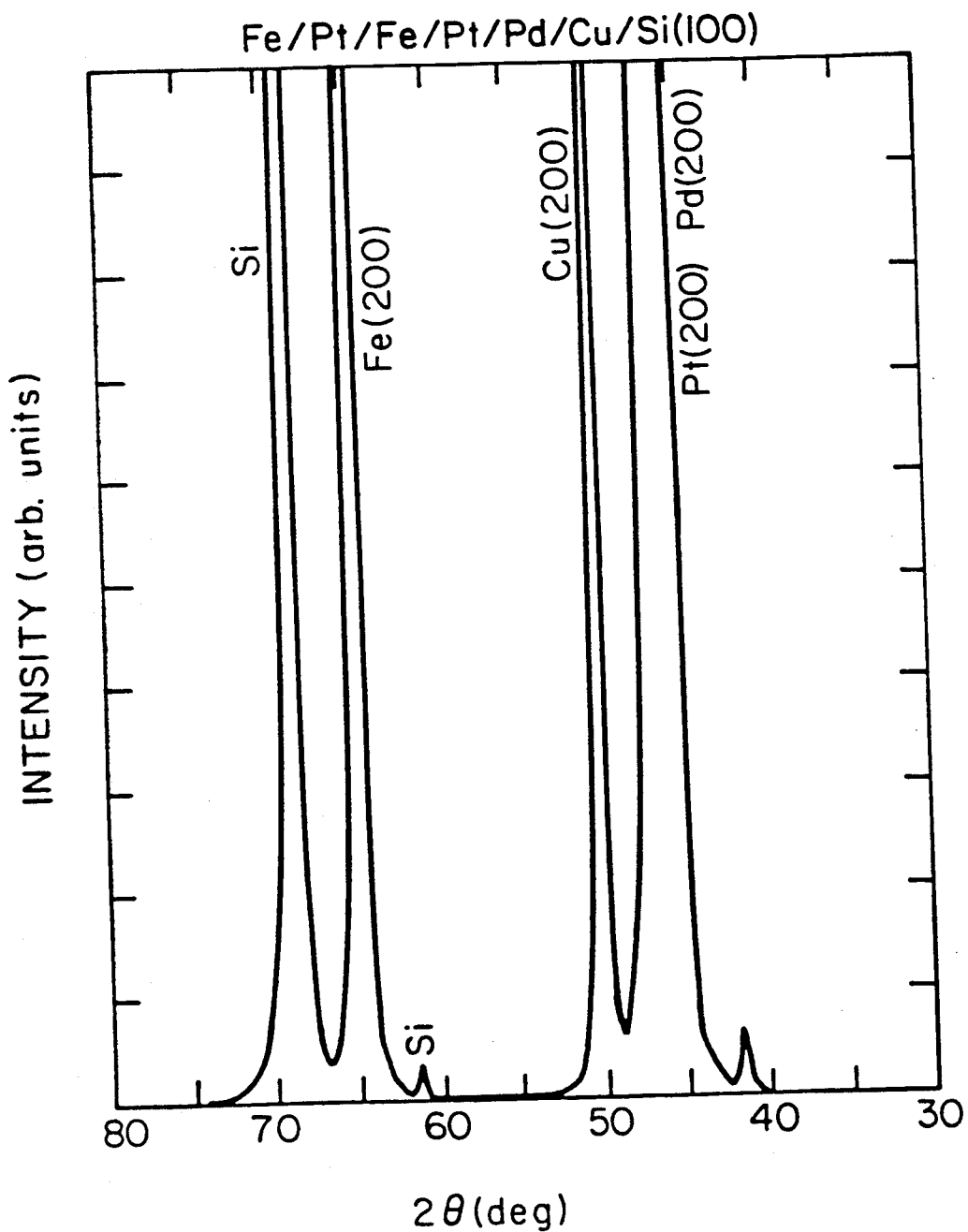
FIG. 27 is a graphical representation of an X-ray diffraction pattern of (100)Fe/(100)Pt/(100)Fe/(100)Pt/(100)Pd/(100)Cu/(100)Si structure manufactured in accordance with the present invention.

FIG. 20 shows the defraction pattern of the (100)Mo/(100)Au/(100)Pd/(100)Cu/(100)Si structure, with only the (200) peaks seen for all the metal layers. FIG. 21 shows the diffraction pattern of the (100)W/(100)Au/(100)Pd/(100)Cu/(100)Si structure, with a strongly (100) orientation for W. Both Mo and W are body-centered cubic metals, where the preferred orientation is (110). The observation of a small (110) peak of W indicates an incomplete (100) epitaxial growth of W in such a structure. Iron also grows epitaxially on the (100)Au, Ag and Pt layers using the MMES technique. Shown in FIGS. 22-24 are the diffraction patterns of the (100)Fe/(100)Au/(100)Pd/(100)Cu/(100)Si, (100)Fe/(100)Ag/(100)Pd/(100)Cu/(100)Si, and (100)Fe/(100)Pt/(100)Pd/(100)Cu/(100)Si, structures, respectively. Only the (200) peaks are seen for all the metal layers deposited. When additional Au, Ag and Pt layers, followed by another Fe layer, are deposited on the structures shown in FIGS. 22-24, the epitaxial growth is retained. The diffraction patterns are shown in FIGS. 25-27 for the (100)Fe/(100)Au/(100)Fe/(100)Au/(100)Pd/(100)Cu/(100)Si, (100)Fe/(100)Ag/(100)Fe/(100)Ag/(100)Pd/(100)Cu/(100)Si, and (100)Fe/(100)Pt/(100)Fe/(100)Pt/(100)Pd/(100)Cu/(100)Si, structures, respectively. All the layers deposited show only the (200) peaks. The successful growth of repeated Fe/Au, Fe/Ag and Fe/Pt layers in the (100) orientation allows the growth of superlattices of these structures with the same (100) orientation.

Practicing the present invention, Cu is found to epitaxially deposit on Si with (100) and (111) Cu films grown using (100) and (111) Si substrates, respectively. Metals which have been epitaxially grown on the Cu seed layers include Ni, Co, Rh, Ir, Ti, Pd, Zr and Hf. Other metals such as Au, Ag, Pt, Fe, V and Cr which do not grow epitaxially on Cu, will grow epitaxially on Pd when using a Pd/Cu/Si structure. Still other metals such as Mo and W which do not grow on Pd, will grow epitaxially on Au when using a Au/Pd/Cu/Si structure. Still further metals, such as Nb which do not grow on Pd or Au, will grow epitaxially on Mo when using a Mo/Au/Pd/Cu/Si structure. Without the epitaxial growth obtained by practicing the present invention, the face-centered cubic metals, such as Ni, Rh, Ir, Pd, Au, Ag, Pt, and sometimes Co, will tend to grow in the (111) orientation. The body-centered cubic metals, such as Fe, V, Cr, Mo and W, will tend to grow in the (110) orientation. The growth of (100) oriented films for the metals is therefore significant using the technique described here.

The above description is primarily concerned with the epitaxial deposition of metal films onto a silicon substrate. It has been demonstrated that similar epitaxial deposition of metal films onto a germanium substrate using the same method as that used in conjunction with a silicon substrate is possible.

Figure 28:
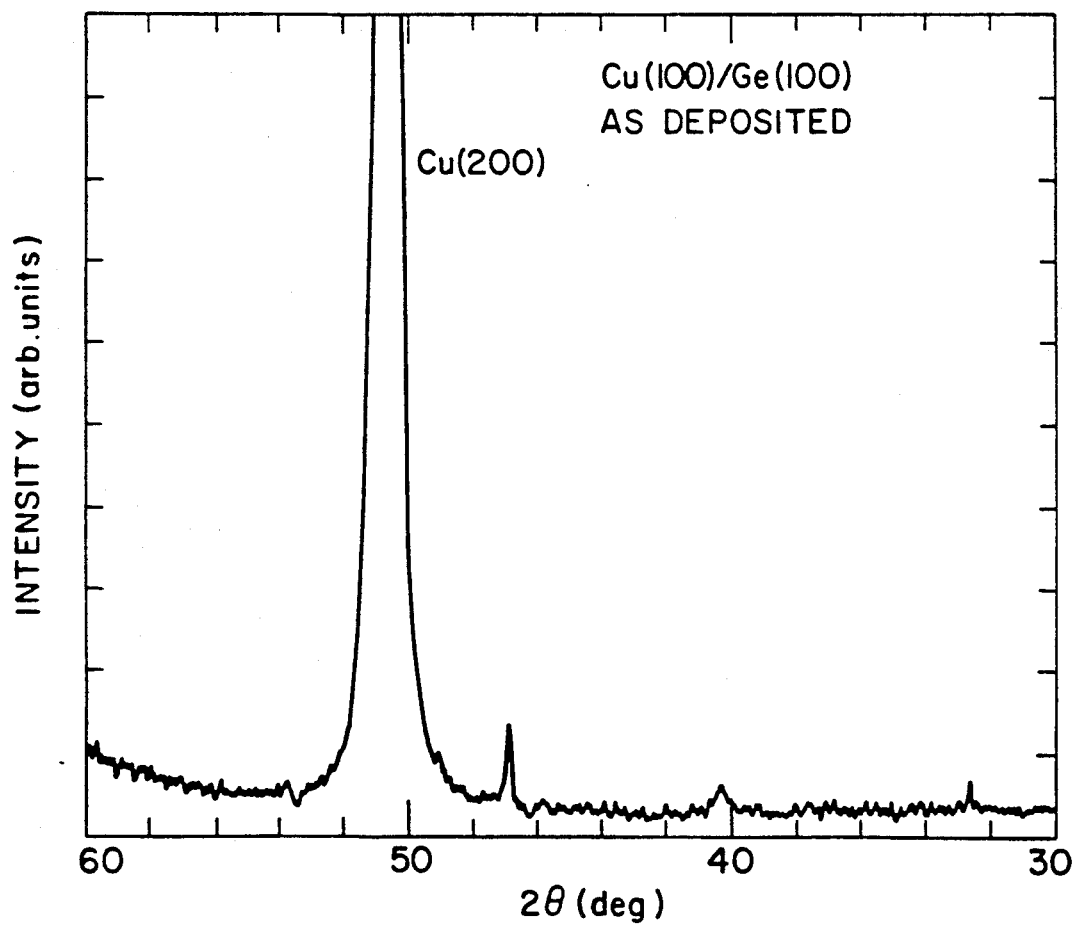
FIG. 28 is a graphical representation of an X-ray diffraction pattern of Cu/(100)Ge structure manufactured in accordance with the present invention.
Figure 29:
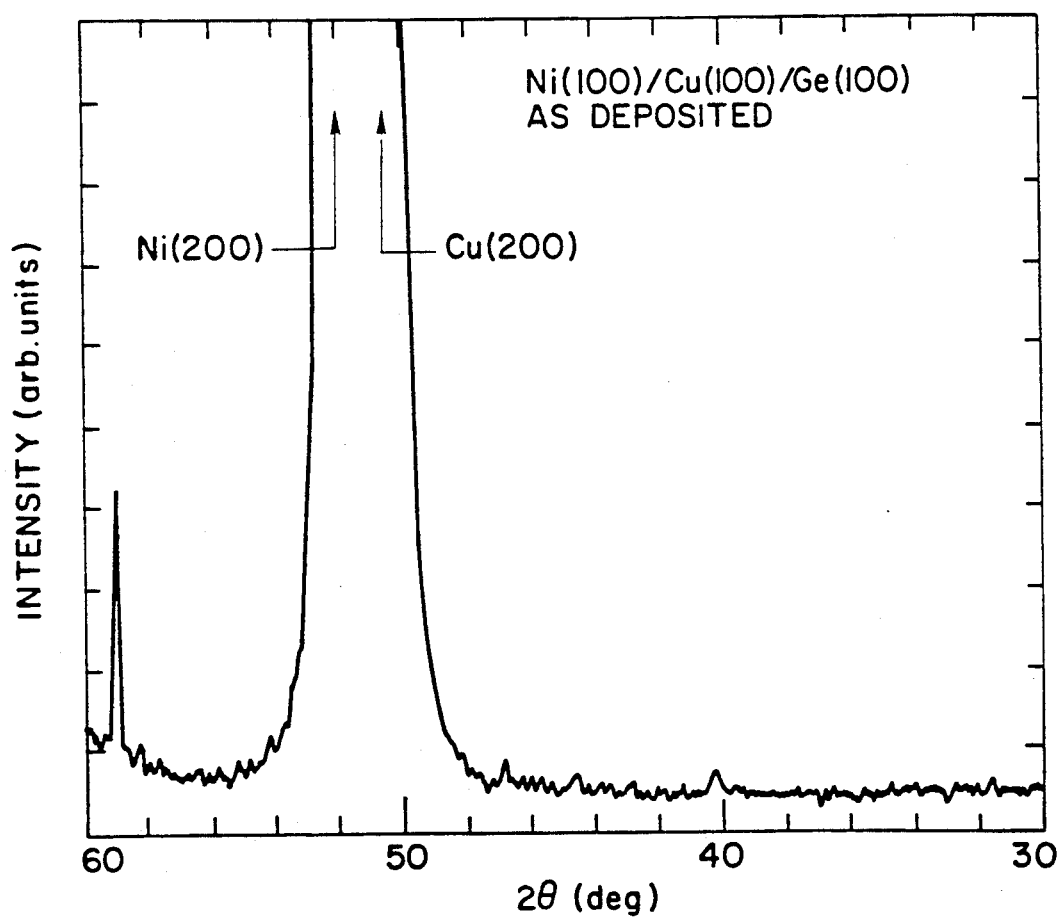
FIG. 29 is a graphical representation of an X-ray diffraction pattern of Ni/Cu/(100)Ge structure manufactured in accordance with the present invention.

FIG. 28 shows the X-ray diffraction pattern of a (100) Cu/100(Ge) structure. Only the (200) peak for Cu and a Ge peak are shown. FIG. 29 shows the X-ray diffraction pattern of a (100)Ni/(100)Cu/(100)Ge structure. Only the (200) peaks for the Cu and Ni metals and a Ge peak are shown.

Having demonstrated the ability to deposit epitaxially grown metals of predetermined orientation on a germanium substrate, the further deposition of metal layers to form superlattices the same as those achieved with a silicon substrate is now possible when practicing the present invention.

While there has been described and illustrated a preferred method for epitaxially growing metal layers on both silicon and germanium substrates and structures manufactured according to the method, it will be apparent to those skilled in the art that modifications and variations are possible without deviating from the broad principles of the present invention which shall be limited solely by the scope of the claims appended hereto.

What is claimed is:

1. A method of epitaxially growing a metal on an elemental semiconductor substrate at room temperature comprising the steps of:

coating an elemental semiconductor substrate of a crystal orientation with an epitaxially grown layer of copper, and if the metal epitaxially grows on copper, then depositing a layer of the metal onto the layer of copper at room temperature without applying external heat to the coated substrate, if the metal does not epitaxially grow on copper, then sequentially depositing at least one intermediate metal layer onto the layer of copper for providing lattice matching between said metal and the last sequentially deposited intermediate metal layer, between sequentially deposited intermediate metal layers and between the first deposited intermediate metal layer and the layer of copper, and depositing a layer of the metal on the last of said sequentially deposited intermediate metal layers, each layer being deposited at room temperature without applying external heat to the coated substrate.

2. A method as set forth in claim 1 wherein said elemental semiconductor substrate comprises silicon.

3. A method as set forth in claim 2 wherein said depositing is by electron beam evaporation in a vacuum of low $10^{-7}$ torr.

4. A method as set forth in claim 2 wherein said deposition is by sputtering.

5. A method as set forth in claim 2 wherein said deposition is by low temperature chemical vapor deposition.

6. A method as set forth in claim 2 wherein said metal is selected from the group consisting of Ni, Co, Pd, Hf, Ir, Zr, Ti and Rh which grow on copper.

7. A method as set forth in claim 2 wherein said metal is selected from the group consisting of Au, Ag, Pt, Fe, V and Cr and said at least one intermediate metal layer is Pd.

8. A method as set forth in claim 2 wherein said metal is selected from the group consisting of Mo and W and said sequentially depositing at least one intermediate metal layer comprises depositing a first layer of Pd and depositing a subsequent layer of Au on said first layer of Pd.

9. A method as set forth in claim 2 wherein said metal is Fe and said sequentially depositing at least one intermediate metal layer comprises depositing a first layer of Pd and depositing a subsequent layer of Au or Ag or Pt on said first layer of Pd.

10. A metal-metal epitaxy on silicon structure manufactured in accordance with the process as set forth in claim 2.

11. A metal-metal epitaxy on silicon structure manufactured in accordance with the process as set forth in claim 3.

12. A metal-metal epitaxy on silicon structure manufactured in accordance with the process as set forth in claim 4.

13. A metal-metal epitaxy on silicon structure manufactured in accordance with the process as set forth in claim 5.

14. A metal-metal epitaxy on silicon structure manufactured in accordance with the process as set forth in claim 6.

15. A metal-metal epitaxy on silicon structure manufactured in accordance with the process as set forth in claim 7.

16. A metal-metal epitaxy on silicon structure manufactured in accordance with the process as set forth in claim 8.

17. A metal-metal epitaxy on silicon structure manufactured in accordance with the process as set forth in claim 9.

18. A method as set forth in claim 1 wherein said elemental semiconductor substrate comprises germanium.

19. A method as set forth in claim 18 wherein said depositing is by electron beam evaporation in a vacuum of low $10^{-7}$ torr.

20. A method as set forth in claim 18 wherein said deposition is by sputtering.

21. A method as set forth in claim 18 wherein said deposition is by low temperature chemical vapor deposition.

22. A method as set forth in claim 18 wherein said metal is selected from the group consisting of Ni, Co, Pd, Hf, Ir, Zr, Ti and Rh which grow on copper.

23. A method as set forth in claim 18 wherein said metal is selected from the group consisting of Au, Ag, Pt, Fe, V and Cr and said at least one intermediate metal layer is Pd.

24. A method as set forth in claim 18 wherein said metal is selected from the group consisting of Mo and W and said sequentially depositing at least one intermediate metal layer comprises depositing a first layer of Pd and depositing a subsequent layer of Au on said first layer of Pd.

25. A method as set forth in claim 18 wherein said metal is Fe and said sequentially depositing at least one intermediate metal layer comprises depositing a first layer of Pd and depositing a subsequent layer of Au or Ag or Pt on said first layer of Pd.

26. A metal-metal epitaxy structure manufactured in accordance with the process as set forth in claim 18.

27. A metal-metal epitaxy structure manufactured in accordance with the process as set forth in claim 19.

28. A metal-metal epitaxy structure manufactured in accordance with the process as set forth in claim 20.

29. A metal-metal epitaxy structure manufactured in accordance with the process as set forth in claim 21.

30. A metal-metal epitaxy structure manufactured in accordance with the process as set forth in claim 22.

31. A metal-metal epitaxy structure manufactured in accordance with the process as set forth in claim 23.

32. A metal-metal epitaxy structure manufactured in accordance with the process as set forth in claim 24.

33. A metal-metal epitaxy structure manufactured in accordance with the process as set forth in claim 25.

34. A metal-metal epitaxially grown structure comprising:
an elemental semiconductor substrate of a crystalline orientation;
a coating layer of epitaxially grown copper deposited on said substrate; and
a layer of a lattice matched metal capable of growing on copper deposited on said copper coating at room temperature without external heat applied to the copper coated substrate.

35. A metal-metal epitaxially grown structure as set forth in claim 34, wherein said elemental semiconductor substrate comprises silicon.

36. A metal-metal epitaxially grown structure as set forth in claim 35, wherein the depositing is by electron beam evaporation.

37. A metal-metal epitaxially grown structure as set forth in claim 35, wherein said metal is selected from the group consisting of Ni, Co, Ti, Pd, Rh, Ir, Zr and Hf.

38. A metal-metal epitaxially grown structure as set forth in claim 34, wherein said elemental semiconductor substrate comprises germanium.

39. A metal-metal epitaxially grown structure as set forth in claim 38, wherein the depositing is by electron beam evaporation.

40. A metal-metal epitaxially grown structure as set forth in claim 38, wherein said metal is selected from the group consisting of Ni, Co, Ti, Pd, Rh, Ir, Zr and Hf.

41. A metal-metal epitaxially grown structure comprising:

an elemental semiconductor substrate of predetermined crystalline orientation;

a coating layer of epitaxially grown copper deposited on said substrate;

an intermediate metal layer lattice matched to said copper coating and said metal capable of growing on copper deposited on said copper at room temperature without external heat applied to the copper coated substrate; and a layer of a lattice matched metal capable of growing on said intermediate metal layer deposited on said intermediate metal layer at room temperature without external heat applied to said intermediate metal layer and copper coated substrate.

42. A metal-metal epitaxially grown structure as set forth in claim 41, wherein said elemental semiconductor substrate comprises silicon.

43. A metal-metal epitaxially grown structure as set forth in claim 42, wherein the depositing is by electron beam evaporation.

44. A metal-metal epitaxially grown structure as set forth in claim 42, wherein said intermediate metal layer is palladium and said metal is selected from the group consisting of gold, silver, platinum, iron, vanadium and chromium.

45. A metal-metal epitaxially grown structure as set forth in claim 41, wherein said elemental semiconductor substrate comprises germanium.

46. A metal-metal epitaxially grown structure as set forth in claim 45, wherein the depositing is by electron beam evaporation.

47. A metal-metal epitaxially grown structure as set forth in claim 45, wherein said intermediate metal layer is palladium and said metal is selected from the group consisting of gold, silver, platinum, iron, vanadium and chromium.

48. A metal-metal epitaxially grown structure comprising:

an elemental semiconductor substrate of a crystalline orientation;

a coating layer of epitaxially grown copper deposited on said substrate;

a first intermediate metal layer lattice matched to said copper coating and capable of growing on said copper deposited on said copper coating at room temperature without external heat applied to the copper coated substrate;

a second intermediate metal layer lattice matched to said first intermediate metal layer and capable of growing on said first intermediate metal layer deposited on said first intermediate metal layer at room temperature without external heat applied to said first intermediate metal layer and copper coated substrate; and a layer of a lattice matched metal capable of growing on said second intermediate metal layer deposited on said second intermediate metal layer at room temperature without external heat applied to said second intermediate metal layer, said first intermediate metal layer and copper coated substrate.

49. A metal-metal epitaxially grown structure as set forth in claim 48, wherein said elemental semiconductor substrate comprises silicon.

50. A metal-metal epitaxially grown structure as set forth in claim 49, wherein the depositing is by electron beam evaporation.

51. A metal-metal epitaxially grown structure as set forth in claim 49, wherein said first intermediate metal layer is palladium, said second intermediate metal layer is gold and said metal is selected from the group consisting of molybdenum, tungsten and iron.

52. A metal-metal epitaxially grown structure as set forth in claim 51, wherein said metal is molybdenum and further comprising a layer of niobium deposited on said molybdenum layer.

53. A metal-metal epitaxially grown structure as set forth in claim 48, wherein said elemental semiconductor substrate comprises germanium.

54. A metal-metal epitaxially grown structure as set forth in claim 53, wherein the depositing is by electron beam evaporation.

55. A metal-metal epitaxially grown structure as set forth in claim 53, wherein said first intermediate metal layer is palladium, said second intermediate metal layer is gold and said metal is selected from the group consisting of molybdenum, tungsten and iron.

56. A metal-metal epitaxially grown structure as set forth in claim 55, wherein said metal is molybdenum and further comprising a layer of niobium deposited on said molybdenum layer.

57. A method of epitaxially growing a predetermined metal on an elemental semiconductor substrate at room temperature comprising the steps of:

(a) coating an elemental semiconductor substrate of a crystal orientation with an epitaxially grown layer of copper;

(b) if the metal is lattice matched and capable of epitaxially growing on copper, then depositing by electron beam evaporation in a vacuum of low $10^{-7}$ torr at room temperature without applying external heat to the coated substrate a layer of the metal onto the layer of copper;

(c) if the metal does not epitaxially grow on copper, then depositing by electron beam evaporation in a vacuum of low $10^{-7}$ torr at room temperature without applying external heat to the coated substrate a first intermediate metal layer which is lattice matched and capable of epitaxially growing on copper onto the layer of copper;

(d) if the metal is lattice matched and capable of epitaxially growing on said first intermediate metal layer, then depositing by electron beam evaporation in a vacuum of low $10^{-7}$ torr at room temperature without applying external heat to the coated substrate a layer of the metal onto the first intermediate metal layer;

(e) if the metal does not epitaxially grow on the first intermediate metal layer, then depositing by electron beam evaporation at room temperature in a vacuum of low $10^{-7}$ torr without applying external heat to the coated substrate a second intermediate metal layer which is lattice matched and capable of epitaxially growing on said first intermediate metal layer on to said first intermediate metal layer; and (f) repeating steps (d) and (e) until the metal is lattice matched and capable of epitaxially growing on an intermediate metal layer.

58. A method as set forth in claim 57, wherein said elemental semiconductor substrate comprises silicon.

59. A method as set forth in claim 57, wherein said elemental semiconductor substrate comprises germanium.

* * * * *